United States Patent
Lee et al.

(10) Patent No.: US 11,936,400 B2
(45) Date of Patent: Mar. 19, 2024

(54) METHOD AND APPARATUS FOR ENCODING AND DECODING POLAR CODE

(71) Applicants: Samsung Electronics Co., Ltd., Suwon-si (KR); Research & Business Foundation SUNGKYUNKWAN UNIVERSITY, Suwon-si (KR)

(72) Inventors: Kwonjong Lee, Suwon-si (KR); Seunghyun Lee, Suwon-si (KR); Sanghyo Kim, Suwon-si (KR); Minyoung Chung, Suwon-si (KR); Hyosang Ju, Suwon-si (KR); Jisang Park, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 17/749,636

(22) Filed: May 20, 2022

(65) Prior Publication Data
US 2022/0393791 A1 Dec. 8, 2022

(30) Foreign Application Priority Data
May 20, 2021 (KR) .................. 10-2021-0064862

(51) Int. Cl.
*H03M 13/29* (2006.01)
*H03M 13/25* (2006.01)
(Continued)

(52) U.S. Cl.
CPC ......... *H03M 13/29* (2013.01); *H03M 13/253* (2013.01); *H03M 13/098* (2013.01);
(Continued)

(58) Field of Classification Search
CPC ........................... H03M 13/29; H03M 13/253
See application file for complete search history.

(56) References Cited

U.S. PATENT DOCUMENTS

2021/0006267 A1* 1/2021 Ha .................. H03M 13/01

FOREIGN PATENT DOCUMENTS

KR 10-2019-0013374 A 2/2019

OTHER PUBLICATIONS

Jiajie Tong, Huazi Zhang, Xianbin Wang, Shengchen Dai, Rong Li, Jun Wang; A Soft Cancellation Decoder for Parity-Check Polar Codes; arXiv:2003.08640v2 [cs.IT], Jul. 2, 2020 (Year: 2020).*

(Continued)

*Primary Examiner* — Joseph D Torres
(74) *Attorney, Agent, or Firm* — Jefferson IP Law, LLP

(57) ABSTRACT

The disclosure relates to a fifth generation (5G) or sixth generation (6G) communication system for supporting a higher data transmission rate. An encoding apparatus may obtain state-indicator information indicating a state of each of bits included in the polar code based on an index set of the bits, identify a weak-bit or a second weak-bit corresponding to a parity bit candidate position preset according to an interconnection within a parity-check (PC)-chain of the polar code and between PC-chains of the polar code as a parity bit, based on a number of weak-bits determined according to the state-indicator information and a number of bits to be used as parity bits, and obtain a polar code including the identified parity bit.

18 Claims, 17 Drawing Sheets

(51) Int. Cl.
  *H03M 13/09* (2006.01)
  *H03M 13/11* (2006.01)
  *H03M 13/13* (2006.01)
  *H04L 1/00* (2006.01)

(52) U.S. Cl.
  CPC ........ *H03M 13/1157* (2013.01); *H03M 13/13* (2013.01); *H04L 1/0063* (2013.01)

(56) References Cited

OTHER PUBLICATIONS

Zhang et al.; Parity-Check Polar Coding for 5G and Beyond; IEEE; 2018.

\* cited by examiner

METHOD AND APPARATUS FOR ENCODING AND DECODING POLAR CODE

CROSS-REFERENCE TO RELATED APPLICATION(S)

This application is based on and claims priority under 35 U.S.C. § 119(a) of a Korean patent application number 10-2021-0064862, filed on May 20, 2021, in the Korean Intellectual Property Office, the disclosure of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) Research & Business Foundation SUNGKYUNKWAN UNIVERSITY.

BACKGROUND

1. Field

The disclosure relates to a method and apparatus for encoding a polar code. More particularly, the disclosure relates to a method and apparatus for decoding a polar code.

2. Description of Related Art

Fifth generation (5G) mobile communication technologies define broad frequency bands such that high transmission rates and new services are possible, and can be implemented not only in "Sub 6 GHz" bands such as 3.5 GHz, but also in "Above 6 GHz" bands referred to as mmWave including 28 GHz and 39 GHz. In addition, it has been considered to implement sixth generation (6G) mobile communication technologies (referred to as Beyond 5G systems) in terahertz bands (for example, 95 GHz to 3 THz bands) in order to accomplish transmission rates fifty times faster than 5G mobile communication technologies and ultra-low latencies one-tenth of 5G mobile communication technologies.

At the beginning of the development of 5G mobile communication technologies, in order to support services and to satisfy performance requirements in connection with enhanced Mobile BroadBand (eMBB), Ultra Reliable Low Latency Communications (URLLC), and massive Machine-Type Communications (mMTC), there has been ongoing standardization regarding beamforming and massive multiple-input multiple-output (MIMO) for mitigating radio-wave path loss and increasing radio-wave transmission distances in mmWave, supporting numerologies (for example, operating multiple subcarrier spacings) for efficiently utilizing mmWave resources and dynamic operation of slot formats, initial access technologies for supporting multi-beam transmission and broadbands, definition and operation of BandWidth Part (BWP), new channel coding methods such as a Low Density Parity Check (LDPC) code for large amount of data transmission and a polar code for highly reliable transmission of control information, L2 pre-processing, and network slicing for providing a dedicated network specialized to a specific service.

Currently, there are ongoing discussions regarding improvement and performance enhancement of initial 5G mobile communication technologies in view of services to be supported by 5G mobile communication technologies, and there has been physical layer standardization regarding technologies such as Vehicle-to-everything (V2X) for aiding driving determination by autonomous vehicles based on information regarding positions and states of vehicles transmitted by the vehicles and for enhancing user convenience, New Radio Unlicensed (NR-U) aimed at system operations conforming to various regulation-related requirements in unlicensed bands, new radio (NR) user equipment (UE) Power Saving, Non-Terrestrial Network (NTN) which is UE-satellite direct communication for providing coverage in an area in which communication with terrestrial networks is unavailable, and positioning.

Moreover, there has been ongoing standardization in air interface architecture/protocol regarding technologies such as Industrial Internet of Things (IIoT) for supporting new services through interworking and convergence with other industries, Integrated Access and Backhaul (IAB) for providing a node for network service area expansion by supporting a wireless backhaul link and an access link in an integrated manner, mobility enhancement including conditional handover and Dual Active Protocol Stack (DAPS) handover, and two-step random access for simplifying random access procedures (2-step random access channel (RACH) for NR). There also has been ongoing standardization in system architecture/service regarding a 5G baseline architecture (for example, service based architecture or service based interface) for combining Network Functions Virtualization (NFV) and Software-Defined Networking (SDN) technologies, and Mobile Edge Computing (MEC) for receiving services based on UE positions.

As 5G mobile communication systems are commercialized, connected devices that have been exponentially increasing will be connected to communication networks, and it is accordingly expected that enhanced functions and performances of 5G mobile communication systems and integrated operations of connected devices will be necessary. To this end, new research is scheduled in connection with eXtended Reality (XR) for efficiently supporting Augmented Reality (AR), Virtual Reality (VR), Mixed Reality (MR) and the like, 5G performance improvement and complexity reduction by utilizing Artificial Intelligence (AI) and Machine Learning (ML), AI service support, metaverse service support, and drone communication.

Furthermore, such development of 5G mobile communication systems will serve as a basis for developing not only new waveforms for providing coverage in terahertz bands of 6G mobile communication technologies, multi-antenna transmission technologies such as Full Dimensional MIMO (FD-MIMO), array antennas and large-scale antennas, meta-material-based lenses and antennas for improving coverage of terahertz band signals, high-dimensional space multiplexing technology using Orbital Angular Momentum (OAM), and Reconfigurable Intelligent Surface (RIS), but also full-duplex technology for increasing frequency efficiency of 6G mobile communication technologies and improving system networks, AI-based communication technology for implementing system optimization by utilizing satellites and Artificial Intelligence (AI) from the design stage and internalizing end-to-end AI support functions, and next-generation distributed computing technology for implementing services at levels of complexity exceeding the limit of UE operation capability by utilizing ultra-high-performance communication and computing resources.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below Accordingly, an aspect of the disclosure is to provide a technique for encoding and decoding of a parity polar code, whereby decoding performance is improved by effectively determining positions of parity bits based on various interconnections between bits.

Additional aspects will be set forth in part in the description which follows and, in part, will be apparent from the description, or may be learned by practice of the presented embodiments.

In accordance with an aspect of the disclosure, a method of encoding a polar code is provided. The method includes obtaining state-indicator information indicating a state of each of bits included in the polar code based on an index set of the bits, identifying a weak-bit or a second weak-bit corresponding to a parity bit candidate position preset according to an interconnection within a parity-check (PC)-chain of the polar code and between PC-chains of the polar code as a parity bit, based on a number of weak-bits determined according to the state-indicator information and a number of bits to be used as parity bits, when a number of the parity bits identified according to the interconnection within the PC-chain of the polar code and between the PC-chains of the polar code corresponds to the number of bits to be used as the parity bits, terminating identification of the weak-bit or the second weak-bit as the parity bit, and obtaining a polar code including the identified parity bit.

In accordance with another aspect of the disclosure, a method of decoding a polar code is provided. The method includes obtaining information and the polar code, the information being about an index of a parity bit identified according to an interconnection within a PC-chain of the polar code and between PC-chains of the polar code, and decoding the obtained polar code based on the information about the index of the parity bit, wherein the parity bit includes a weak-bit or a second weak-bit corresponding to a parity bit candidate position preset according to the interconnection within the PC-chain of the polar code and between the PC-chains of the polar code, based on a number of weak-bits determined according to state-indicator information and a number of bits to be used as parity bits, and wherein the state-indicator information indicates a state of each of bits included in the polar code based on an index set of the bits.

In accordance with another aspect of the disclosure, an apparatus for decoding a polar code is provided. The apparatus includes a transceiver and at least one processor, wherein the at least one processor is configured to obtain state-indicator information indicating a state of each of bits included in the polar code based on an index set of the bits, to identify a weak-bit or a second weak-bit corresponding to a parity bit candidate position preset according to an interconnection within a PC-chain of the polar code and between PC-chains of the polar code, based on a number of weak-bits determined according to the state-indicator information and a number of bits to be used as parity bits, when a number of the parity bits identified according to the interconnection within the PC-chain of the polar code and between the PC-chains of the polar code corresponds to the number of bits to be used as the parity bits, to terminate identification of the weak-bit or the second weak-bit as the parity bit, and to obtain a polar code including the identified parity bit.

In accordance with another aspect of the disclosure, an apparatus for decoding a polar code is provided. The apparatus includes a transceiver and at least one processor, wherein the at least one processor is further configured to obtain information and the polar code, the information being about an index of a parity bit identified according to an interconnection within a PC-chain of the polar code and between PC-chains of the polar code, and to decode the obtained polar code based on the information about the index of the parity bit, wherein the parity bit includes a weak-bit or a second weak-bit corresponding to a parity bit candidate position preset according to the interconnection within the PC-chain of the polar code and between the PC-chains of the polar code, based on a number of weak-bits determined according to the state-indicator information and a number of bits to be used as parity bits, and wherein the state-indicator information indicates a state of each of bits included in the polar code based on an index set of the bits.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
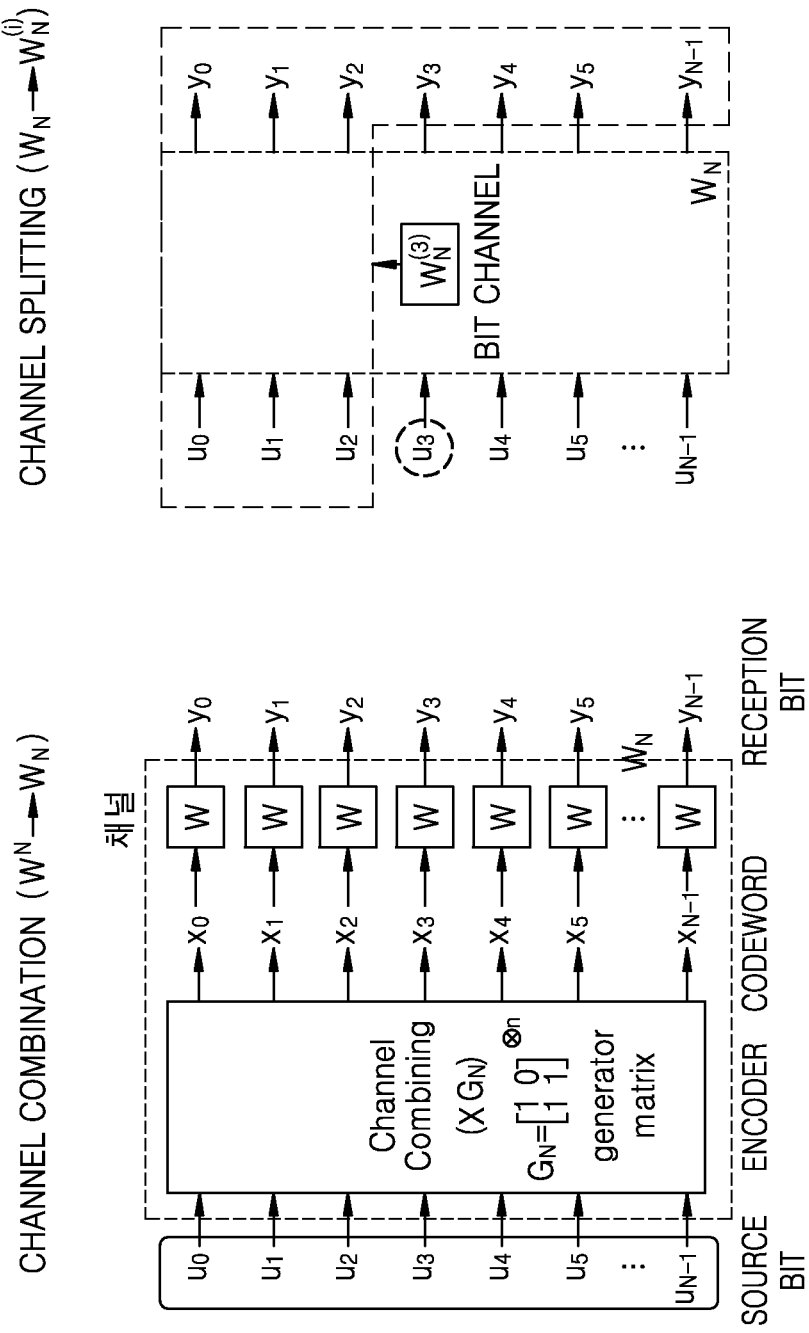
FIG. 1 is a diagram for describing channel combination and channel splitting processes for a polar code according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the following description of embodiments, descriptions of techniques that are well known in the art and not directly related to the disclosure are omitted. This is to clearly convey the gist of the disclosure by omitting an unnecessary explanation. The terms used in the specification are defined in consideration of functions used in the disclosure, and can be changed according to the intent or commonly used methods of users or operators. Accordingly, definitions of the terms are understood based on the entire descriptions of the present specification.

For the same reasons, elements may be exaggerated, omitted, or schematically illustrated in drawings for clarity. Also, the size of each element does not entirely reflect the actual size. The same reference numerals are assigned to the same or corresponding elements in the drawings.

The advantages and features of the disclosure and methods of achieving them will become apparent with reference to embodiments of the disclosure described in detail below with reference to the accompanying drawings. In this regard, the embodiments of the disclosure may have different forms and should not be construed as being limited to the descriptions set forth herein. Rather, these embodiments of the disclosure are provided so that the disclosure will be thorough and complete and will fully convey the concept of the disclosure to one of ordinary skill in the art, and the disclosure will only be defined by the appended claims. In the specification, the same elements are denoted by the same reference numerals. In describing the disclosure, when the detailed description of the relevant functions or configurations is determined to unnecessarily obscure the gist of the disclosure, the detailed description thereof may be omitted.

Throughout the disclosure, the expression "at least one of a, b, or c" indicates only a, only b, only c, both a and b, both a and c, both b and c, all of a, b, and c, or any variations thereof.

Throughout the specification, a layer may also be referred to as an entity.

Hereinafter, a base station (BS) is an entity that performs resource allocation of a user equipment (UE), and may be at least one of gNode B, eNode B, NodeB (or xNodeB (here, x is an alphabet including g and e)), wireless access unit, a base station controller, a satellite, an airborne, or a node on a network. The UE may include a mobile station, a vehicle, a satellite, an airborne, a cellular phone, a smartphone, a computer, or a multimedia system capable of performing a communication function. In the disclosure, a downlink (DL) denotes a wireless transmission path of a signal transmitted by a BS to a UE, and an uplink (UL) denotes a wireless transmission path of a signal transmitted by a UE to a BS. In addition, a sidelink (SL), which means a wireless transmission path of a signal transmitted by a UE to another UE, may be present.

Also, a long term evolution (LTE), long term evolution-advanced (LTE-A), or 5G system will be described as an example, but the embodiments of the disclosure may also be applied to other communication systems having a similar technical background or channel type. For example, a 5G-Advance, NR-Advance, or 6G mobile communication technology (6G), which are developed after the 5G mobile communication technology (or new radio (NR)) may be included in the systems described above, and 5G described below may be a concept including an existing LTE, LTE-A, and other similar services. The disclosure is applicable to other communication systems through modification at the discretion of one of ordinary skill in the art without greatly departing from the scope of the disclosure.

In this case, it will be understood that each block of flowchart illustrations and combinations of blocks in the flowchart illustrations may be implemented by computer program instructions. Because these computer program instructions may be loaded into a processor of a general-purpose computer, special purpose computer, or other programmable data processing device, the instructions, which are executed via the processor of the computer or other programmable data processing device generate means for implementing functions specified in the flowchart block(s). Because these computer program instructions may also be stored in a computer-executable or computer-readable memory that may direct a computer or other programmable data processing device to function in a particular manner, the instructions stored in the computer-executable or computer-readable memory may produce an article of manufacture including instruction means that implement the functions specified in the flowchart block(s). Because the computer program instructions may also be loaded onto a computer or other programmable data processing device, a series of operational steps may be performed on the computer or other programmable device to produce a computer implemented process, and thus the instructions executed on the computer or other programmable device may provide steps for implementing the functions specified in the flowchart block(s).

In addition, each block of the flowchart illustrations may represent a module, segment, or portion of code, which includes one or more executable instructions for performing specified logical function(s). It should also be noted that in some alternative implementations, the functions noted in the blocks may occur out of the order. For example, two blocks illustrated in succession may in fact be executed substantially concurrently, or the blocks may sometimes be executed in a reverse order, depending on the functions involved therein.

In this case, the term "-er/or" used in the present embodiment refers to a software or hardware component, such as a field-programmable gate array (FPGA) or an application-specific integrated circuit (ASIC), which performs certain tasks. However, the term "module" or "-er/or" is not limited to software or hardware. The term "module" or "-er/or" may be configured in an addressable storage medium or may be configured to reproduce one or more processors. Thus, for example, the term "-er/or" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. The functionality provided in components and "-er/ors" may be combined into fewer components and "-er/ors" or may be further separated into additional components and "-er/ors". Further, the elements and "-er/ors" may be implemented to operate one or more central processing units (CPUs) in a device or a secure multimedia card. Also, according to an embodiment, a "-er/or" may include one or more processors.

FIG. 1 is a diagram for describing channel combination and channel splitting processes for a polar code according to an embodiment of the disclosure.

The polar codes are error correction codes capable of theoretically achieving a channel capacity, and the codes may be designed by using "channel polarization" including channel combination and channel splitting. x bits ($x_i$: an $i^{th}$ codeword bit) may be generated through a multiplication of u bits ($u_i$: an $i^{th}$ source bit) by a generator matrix $$G_N = G_2^{\otimes n}\left(G_2 = \begin{pmatrix} 0 & 1 \\ 1 & 1 \end{pmatrix}, (\cdot)^{\otimes}: \text{Kronecker product.}\right)$$

In addition, each of the codeword bits may experience a channel W that is independently and identically distributed (i.i.d), and thus, may be generated as y bits ($y_i$:: an $i^{th}$ reception signal bit). In this case, a single large combination channel $W_N$ that connects bits of a u domain and bits of a y domain may be obtained, and this process is referred to as channel combination.

Channel splitting refers to a process of obtaining $W_N^{(i)}$ ($i \in \{0,1,\ldots,N-1\}$), which is a bit channel to be experienced by each of the u bits, from the combination channel $W_N$. The bit channel to be experienced by the u bits includes a virtual bit channel. In the channel splitting process, each of the source (u) bits may be sequentially decoded one bit at a time. In this case, in order to evaluate quality of bit channels to be experienced by each of the u bits, when it is assumed that previously-decoded results (($u_0, u_1, \ldots, u_{i-1}$)) were properly decoded, a bit channel with an ith source bit as an input and $u_0^{i-1}$ and $y_0^{N-1}$ as outputs may be obtained. For example, for $u_3$, a bit channel $W_N^{(3)}$ with $u_3 (\in \{0,1\})$ as an input and $u_0^2$, $y_0^3$ as outputs may be obtained.

Through channel polarization including channel combination and channel splitting, N bit channels $W_N^{(i)}$ (i=0,2, . . . , N−1) having different quality from each other may be obtained from N i.i.d channels having the same quality as each other. In this case, in order to evaluate quality of the N bit channels, methods, such as density evaluation, Gaussian approximation, and polarization reliability, may be considered. In the disclosure, parity bits for designing a polar code may be provided by using a bit channel quality evaluation method based on polarization reliability from among various quality evaluation methods.

In the polarization reliability method, quality of each of bit channels is expressed based on a weighted sum, and quality of a bit channel $W_N^{(i)}$ of which the index (i.e., decimal index) is i for a code length $N(=2^n)$ may be represented as in Equation 1 shown below.

$$PW_N^{(i)} = \sum_{j=0}^{n-1} b_j (2^{1/4})^j \qquad \text{Equation 1}$$

In Equation 1, $b_j$ may be the binary expression of an index $j (\in \{0,1,\ldots,N-1\})$. When the binary expression of the index i is $(b_{n-1}b_{n-2}\ldots b_1b_0)_2$, $b_i$ indicates a bit value within $(b_{n-1}b_{n-2}\ldots b_1b_0)_2$. $b_0$ indicates a least significant bit (LSB), and $b_{n-1}$ indicates a most significant bit (MSB). For example, when N=8, quality of all eight bit channels are $W_8^{(0)}=0$, $PW_8^{(1)}=1$, $PW_8^{(2)}=1.189$, $PW_8^{(3)}=2.189$, $PW_8^{(4)}=1.414$, $PW_8^{(5)}=2.414$, $PW_8^{(6)}=2.603$, $PW_8^{(7)}=3.603$, and the greater the quality value, the higher the reliability may be determined. In the polarization reliability evaluation method, quality of bit channels may be simply calculated as a weighted sum regardless of a channel type or code parameters (e.g., N, K). Unlike density evaluation or Gaussian approximation methods in which code design is performed according to a channel code parameter, the polarization reliability evaluation method may support (rate-compatible) various code rates by using a single sequence.

However, when designing a code of a polar code according to the related art, a 2×2 polarization kernel matrix is considered, and thus, a code-length is limited to $2^n$(n=1, 2, . . . ). In order to apply a polar code to an actual application, an arbitrary code-length has to be supported, and thus, various code rate-matching methods, such as puncturing/shortening/repetition, may be applicable.

In the puncturing, J bits are removed from an x domain so that a codeword bit becomes M(=N−J), and the J punctured bits are not transmitted. Because a decoder does not include any information about bits to be punctured, a log-likelihood ratio (LLR) corresponding to the corresponding bits is set to 0. In the shortening, J bits to be shortened are selected in the u domain, and values of these bits are fixed at 0. Unlike puncturing, a receiver is aware of information indicating that the values of the selected bits are determined as 0. Accordingly, an LLR value of these bits may be initially set to a very large value (for example, a maximum value that may be set in hardware) before decoding.

A representative related art corresponding to the disclosure includes a code design method for a polar code using parity-check (PC). In a PC polar code, source (u) bits that may be vulnerable to errors during SC decoding of a polar code may be protected through single-parity-check pre-coding. In addition, in terms of a code, bits having a minimum weight are used as parity bits so that the minimum distance characteristic of a code is improved (a minimum distance is increased or the number of codewords having a minimum weight is reduced), an SCL decoding performance is further improved. The PC polar code may have excellent error rate performance with respect to general code parameter (e.g., various N, K) values, compared to a polar code using only cyclic redundancy check (CRC).

Meanwhile, in the disclosure, the PC polar code may be described as a polar code including a parity bit.

Figure 2:
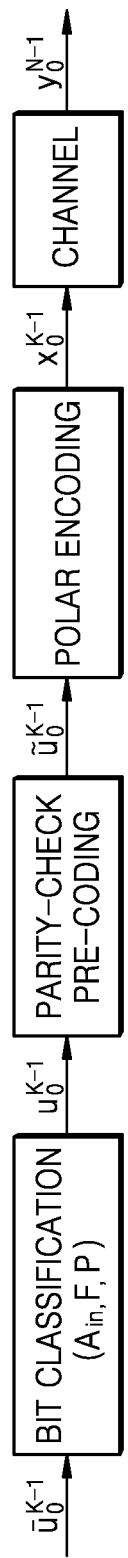
FIG. 2 is a diagram illustrating a structure of a transmitter for a parity-check (PC) polar code according to an embodiment of the disclosure.

FIG. 2 is a diagram illustrating a structure of a transmitter for a PC polar code according to an embodiment of the disclosure.

Referring to FIG. 2, unlike a normal transmission structure of a polar code with which a CRC code is not concatenated, in the transmitter for the PC polar code, a two-step process of bit-classification and PC pre-coding may be further performed before polar encoding. A polar encoding and a channel in FIG. 2 may correspond to those described above with reference to FIG. 1.

The design goal of a polar code for a PC polar code is to keep a minimum code distance and the total reliability of bits in an information set high, and to have excellent error rate performance during SCL decoding. In the bit-classification step, index sets $\mathcal{A}_{in}$, $\mathcal{P}$, $\mathcal{F}$ to be used as information bits/parity bits/shortened bits for code rate-matching may be determined, and an input thereof is $\bar{u}_0^{K-1}$, and an output is $u_0^{K-1}$. Here, $\mathcal{A}_{in}$ is an index set of information bits, $\mathcal{P}$ is an index set of parity bits for pre-coding, and $\mathcal{F}$ is an index set of bits shortened for code rate-matching. Hereinafter, bit-classification performed before polar encoding is described in greater detail with reference to FIG. 3, and PC pre-coding is described in greater detail with reference to FIG. 4.

Figure 3:
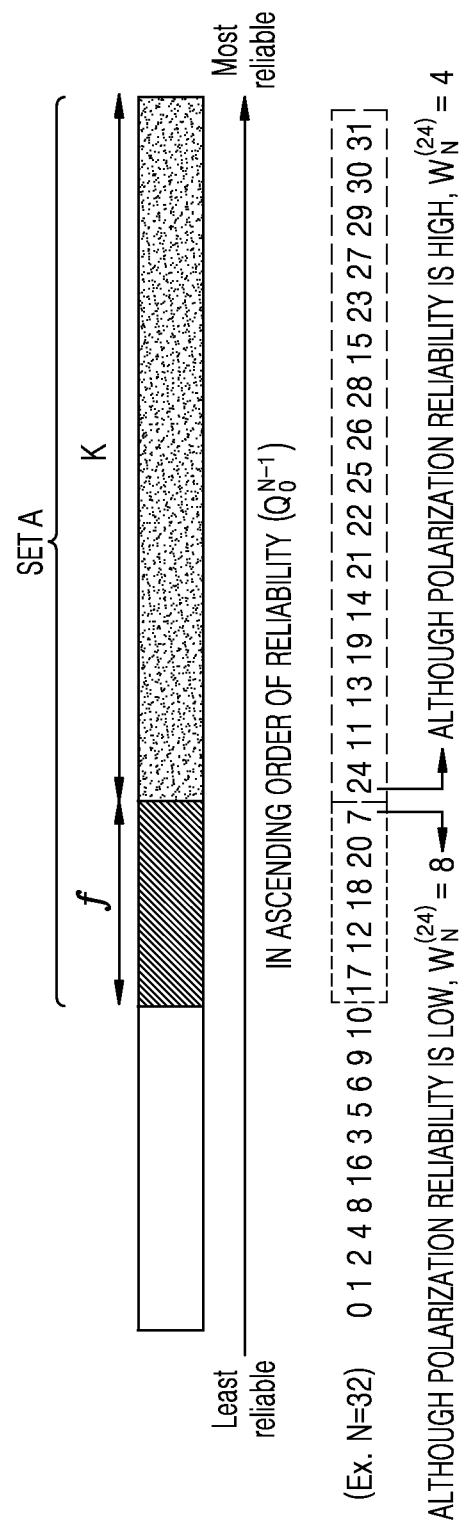
FIG. 3 is a diagram for describing a bit classification process for a PC polar code according to an embodiment of the disclosure.

FIG. 3 is a diagram for describing a bit-classification process for a PC polar code according to an embodiment of the disclosure.

Referring to FIG. 3, first, when a message length in a mother code of a polar code having a length of $N=2^n$ is, in order to finally select K information bit channels, f bits which may have a critical influence on the decoding performance from among (K+f) bit channels which are most excellent in terms of polarization reliability may be used as parity bits, and message bits may be allocated to the remaining K bit channels. An index set of (K+f) bits that are most excellent in terms of channel polarization may be defined as $\mathcal{A}$.

A parity bit may be defined as a union of different index sets $\mathcal{P}\mathcal{A}$ and $\mathcal{P}\mathcal{A}_c$ ($\mathcal{P} = \mathcal{P}\mathcal{A} \cup \mathcal{P}\mathcal{A}_c$) according to positions to which bits originally belong. In more detail, an index set of f parity bits selected from the set may be defined as $\mathcal{P}\mathcal{A}$, and an index set of all bits in the remaining set $\mathcal{A}^c$ may be defined as $\mathcal{P}\mathcal{A}_c$. A value of f may be determined by Equation 2 shown below, but this is only an example, and a method of determining the value of f is not limited thereto. In Equation 2, α may be set to a value of 1, in a case of SCL decoding of which the list size (L) is 8.

$$f = \log_2 N \times \left( \alpha - \left| \alpha \left( \frac{K}{N} - \frac{1}{2} \right) \right|^2 \right)$$

Equation 2

Referring to FIG. 3, it may be identified that an index of a bit channel that is most reliable in terms of polarization reliability is positioned at the rightmost side. Indices of (K+f) bit channels from the rightmost constitute the set $\mathcal{A}$.

A group 2 including K bit channels having the highest polarization reliability has high polarization reliability, but may include bits having a low row weight in the corresponding generator matrix. On the other hand, a group (group 1) including $(K-1)^{th}$ to $(K+f)^{th}$ bit channels has low polarization reliability, but may include bits having a high row weight.

For example, in a code sequence of FIG. 3, where N=32, a bit of which the index is "24", included in group 2 has high polarization reliability and a row weight of 4, whereas a bit of which the index is "7", included in group 1 has low polarization reliability and a row weight of 8, which is greater than that of the bit described above. However, because bits having a minimum weight may have a significant effect on the actual decoding performance, bits which are vulnerable in terms of a minimum distance in a union $\mathcal{A}$ of groups 1 and 2 may be used as parity bits.

In the disclosure, bits having a minimum weight in the set $\mathcal{A}$ are described as weak-bits, and bits having a second minimum weight are described as second weak-bits. According to an embodiment of the disclosure, some or all of weak-bits may be selected as parity bits, and some of second weak-bits may also be selected as parity bits.

An index set of weak-bits having a minimum weight and an index set of second weak-bits having a second minimum weight may be defined as in Equation 3 shown below.

$$\mathcal{A}_m^1 = \{i \in \mathcal{A} \mid w_N^{(i)} = d_{min}\}$$

$$\mathcal{A}_m^2 = \{i \in \mathcal{A} \mid w_N^{(i)} = 2d_{min}\}$$

Equation 3

In Equation 3, $\mathcal{A}$ indicates an index set of (K+f) bits having the highest polarization reliability (e.g., polarization weight), $w_N^{(i)}$ indicates a row weight in a generator matrix $G_N (=G_2^{\otimes n})$ corresponding to an $i^{th}$ bit channel, and $d_{min}$ indicates a minimum value from among row weights corresponding to each of the (K+f) bit channels having the highest polarization reliability.

According to an embodiment of the disclosure, when the number ($|\mathcal{A}_m^1|$) of weak-bits in the set $\mathcal{A}$ is greater than the number (f) of parity bits (i.e., parity group 2) to be actually selected, f weak-bits from among the $|\mathcal{A}_m^1|$ weak-bits may be selected as parity bits. In the related art, polarization reliability is used as a criterion for selecting f parity bits from among weak-bits, and f bits having the largest polarization reliability value may be selected. In addition, when the number (f) of parity bits to be actually selected is greater than the number ($|\mathcal{A}_m^1|$) of weak-bits (i.e., $>|\mathcal{A}_m^1|$), all of the weak-bits may be selected as parity bits, and an additional parity bit may be further selected from among second weak-bits. In this case, in the related art, a descending order of polarization reliability is used as a criterion for selecting a parity bit from among second weak-bits.

Figure 4:
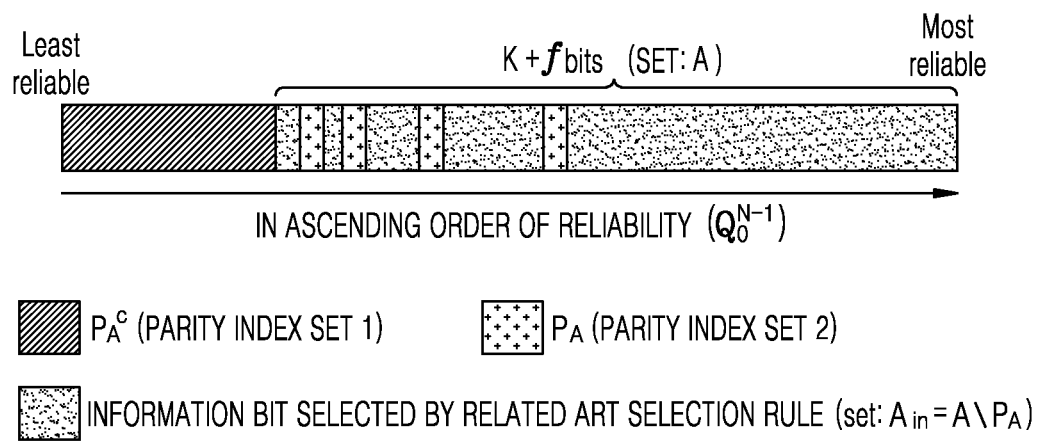
FIG. 4 is a diagram for describing a PC pre-coding process according to an embodiment of the disclosure.

Through the parity selection process based on polarization reliability, a parity index set $\mathcal{P}\mathcal{A}$ may be determined, and $\mathcal{P}\mathcal{A}$, $\mathcal{P}\mathcal{A}_c$, $\mathcal{A}_{in}(=\mathcal{A} \setminus \mathcal{P}\mathcal{A})$, which are determined through bit-classification, may be expressed as in FIG. 4.

FIG. 4 is a diagram for describing a PC pre-coding process according to an embodiment of the disclosure.

After an index set of bits to be used as parity bits (parity group 2: $\mathcal{P}\mathcal{A}$) or information bits ($\mathcal{A}_{in}$) are determined, as described above, values of the parity bits may be determined through PC pre-coding.

The PC pre-coding may be performed in a bit group defined in the u domain. First, bits of the u domain consisting of information bits and parity bits may be classified into l sets. Pre-coding using a single parity-check code may be performed in each of the classified groups. The information bits are filled with message bits that are encoding inputs, and the parity bits may be determined as a binary-sum of all preceding information bits in the bit group.

In the related art, cyclic shift register (CSR) which is easy for hardware implementation is used as a method for pre-coding. For CSR having a length of l, bits of the u domain may be divided into a total of l bit groups, and bits having the same remainder obtained by dividing the bits by l may be grouped together. In each of bit groups obtained as a result of the grouping, elements are sequentially used in an encoding process, and thus are called PC-chain. For example, when l is 5, bits having indices with the same remainder obtained by dividing the bits by 5 may have an interconnection with each other.

Figure 5:
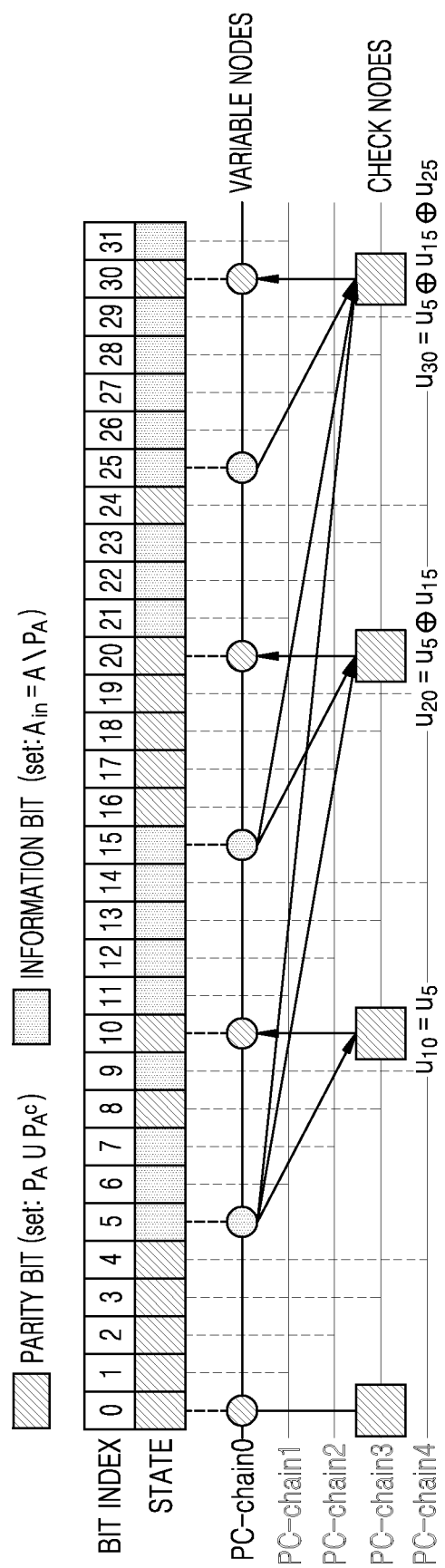
FIG. 5 is a diagram for describing an interconnection for each PC chain in a polar code according to an embodiment of the disclosure.

FIG. 5 is a diagram for describing an interconnection for each PC-chain in a polar code according to an embodiment of the disclosure.

Referring to FIG. 5, an interconnection for each PC-chain may be identified when using CSR of which the length is 5 with respect to a (32,18) polar code. For PC-chain 0, bits having an index of {0,5,10,15,20,25,30} are grouped together, wherein an index set of parity bits in PC-chain 0 is $\mathcal{P}=\{0,10,20,30\}$, and an index set of information bits is $\mathcal{A}_{in}=\{5,15,25\}$. A parity bit $u_{10}$ having an index of 10 may be determined as the sum of the previous information bits, i.e., $u_{10}=u_5$. In this case, a value of $5^{th}$ bit having relatively higher polarization reliability (e.g., polarization weight) may be substituted for a value of $10^{th}$ parity bit that is a weak-bit, and thus, the weak-bit may be protected. l=5 is a parameter determined to offset, as much as possible, the influence of error propagation that occurs during SC decoding of an actual polar code, but this is only an example, and the parameter may have an arbitrary value satisfying l>1.

Figure 6:
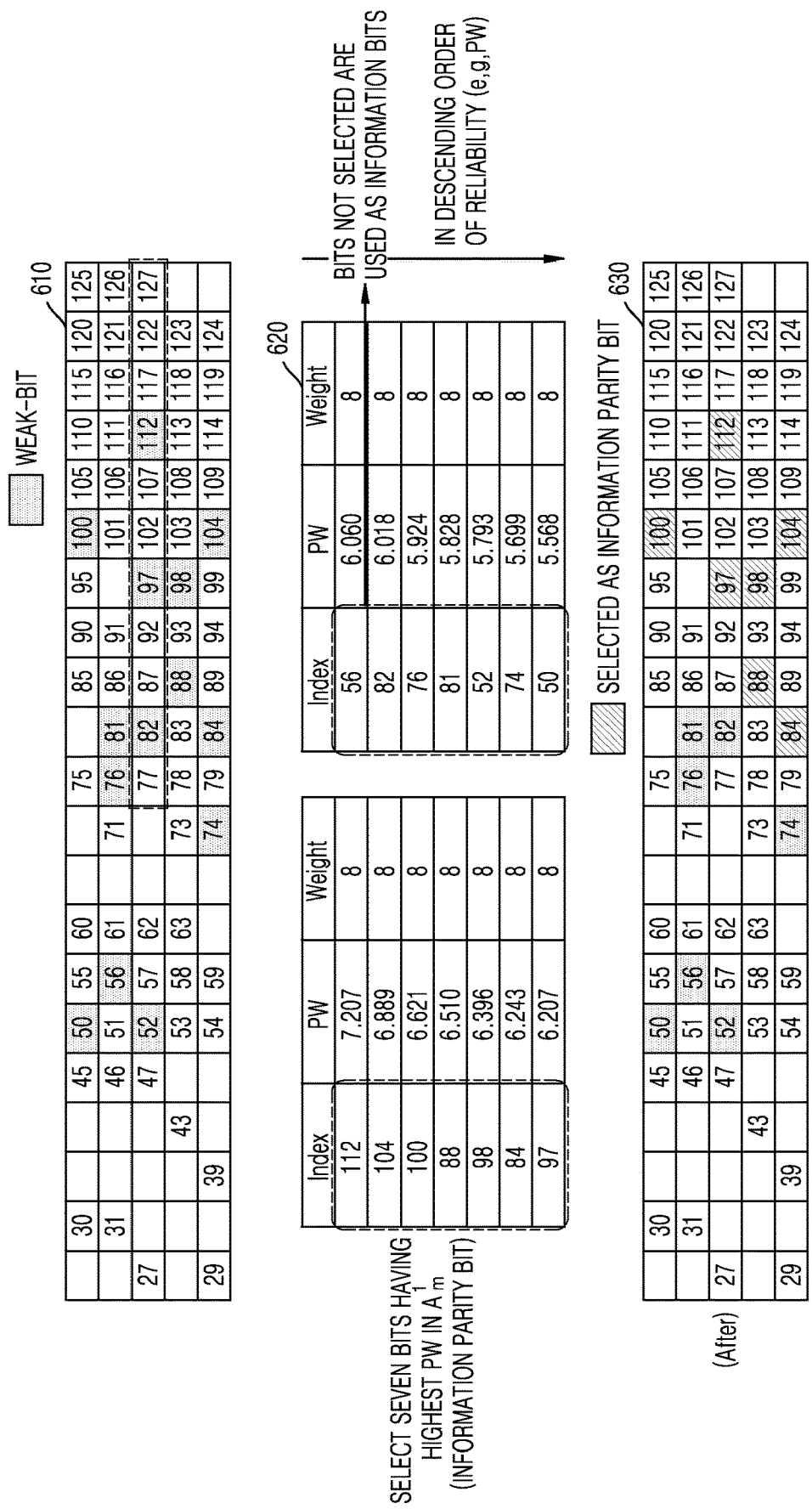
FIG. 6 is a diagram for describing a method of determining a parity set of a PC polar code according to an embodiment of the disclosure.

FIG. 6 is a diagram for describing a method of determining a parity set of a PC polar code, according to an embodiment of the disclosure.

Referring to FIG. 6, a method of selecting a set $\mathcal{PA}$ from among parity bits of a (128,70) polar code may be identified. In Table 610 of PC-chains before the $\mathcal{PA}$ is selected, only index of bits in the set $\mathcal{A}$ is expressed in each of the PC-chains, and all bits of which the index is not expressed are bits having an index in the set $\mathcal{PA}_c$. In addition, in Table 610 of the PC-chains before the set $\mathcal{PA}$ is selected, all $|\mathcal{A}_m|(=14)$ weak-bits having a minimum weight are highlighted. A profile 620 (e.g., a polarization weight and row weight corresponding to each of the bits) of the weak-bits may be included. In the embodiment of FIG. 6, the number of weak-bits (i.e., 14) is greater than the number (f=7) of parity bits to be selected, and thus, seven bits having the highest reliability may be selected as parity bits. In other words, as indicated in Table 630 of the PC-chains after selection of $\mathcal{PA}$, a set $\mathcal{PA}$ of the selected parity bits is {112,104,100,88,98,84,97}. On the other hand, in the remaining bits other than bits having an index in the set $\mathcal{PA}$, data may be transmitted (set $\mathcal{A}_{in}=\mathcal{A}\setminus\mathcal{PA}$).

As described above with reference to FIG. 6, in a related-art PC polar code, when the index set $\mathcal{PA}$ is determined from among weak-bits or second weak-bits, polarization reliability is used as the only selection criterion. However, as a code parameter changes, the composition of weak-bits and information bits within each PC-chain is changed, and in this case, a parity bit selection method in which a weakness of each code parameter may be compensated for as much as possible is required.

In addition, in the related-art PC polar code, a length of a subblock including weak-bit(s) in a PC-chain and the number of weak-bits are not considered. Further, because a sequential decoding is performed, the polar code is not free from the effect of error propagation in which an error in a specific bit causes an error in subsequent bits. Therefore, independence between the PC-chains is not ensured, and a parity bit selection method that considers error propagation is necessary.

Figure 7:
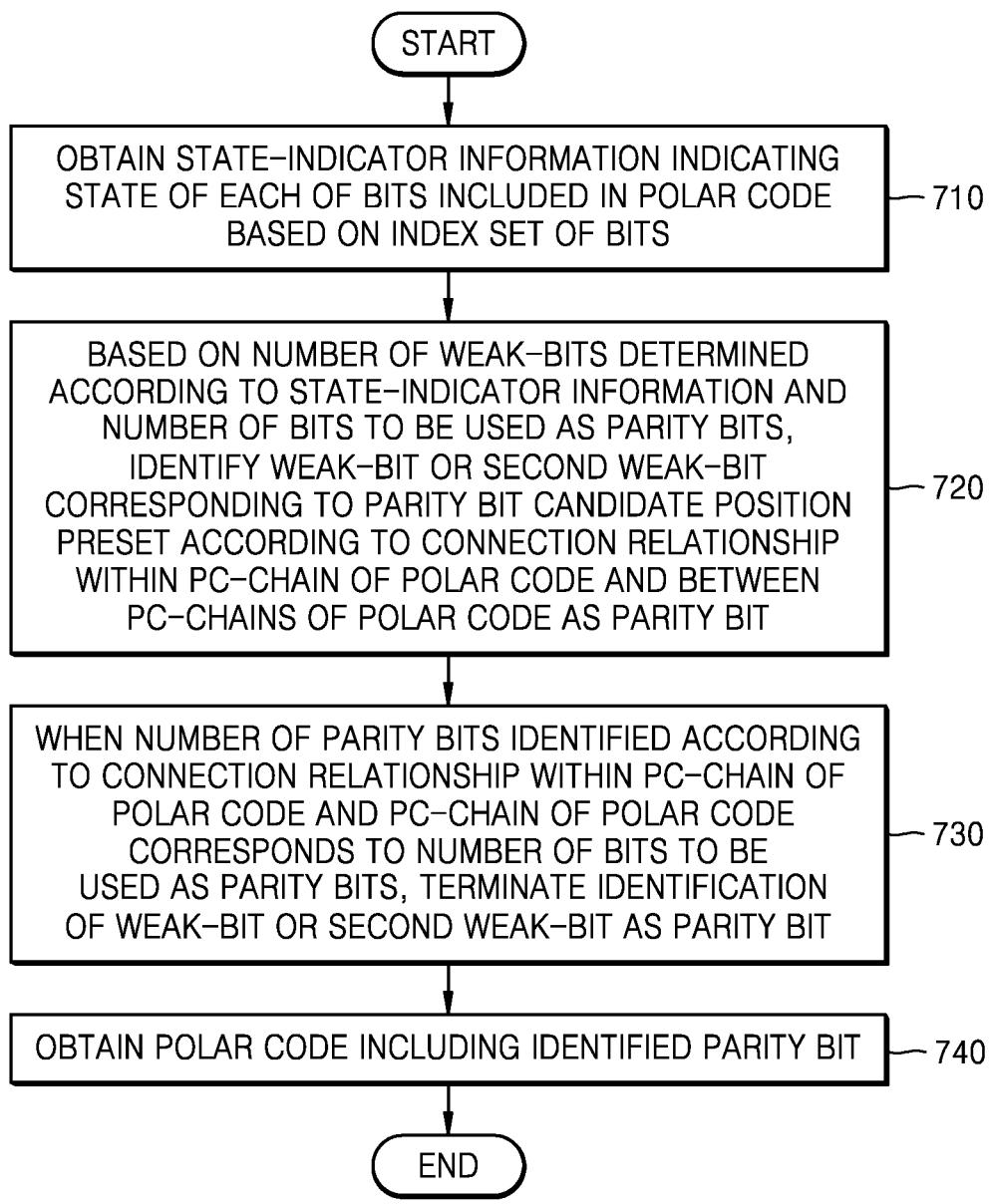
FIG. 7 is a flowchart of a method of obtaining a polar code including a parity bit, according to an embodiment of the disclosure.

FIG. 7 is a flowchart of a method of obtaining a polar code including a parity bit, according to an embodiment of the disclosure.

In the disclosure, a parity bit may be selected by considering a complex interconnection between a PC-chain and bits within the PC-chain. An encoding apparatus according to an embodiment may select positions of weak-bits vulnerable to errors by using the number of parity bits to be selected and add the corresponding bits to the set $\mathcal{PA}$, thereby strengthening a local protection level.

SC/SCL decoding of a polar code is sequential decoding, and thus, the decoding is sequentially performed one bit at a time in an ascending order of bit indices. In this case, an error in a specific bit may cause a continuous error to a subsequent bit, and this is called error propagation. In particular, most of the error propagation may occur with a $2^k$ spacing due to the design characteristics of a polar code.

In the related-art PC polar code, in order to offset the effect of error propagation, a CSR of which the length is 5 ($\neq 2^k$, k is an integer) is used, but when bits of which the indices are neighboring are all weak-bits (or second weak-bits), the PC polar code may be very vulnerable to errors. In other words, even when an arbitrary l is used, the correlation between bits between PC-chains still remains, and thus, a problem of error propagation may occur.

In addition, when multiple weak-bits (or second weak-bits) are present in a specific PC-chain or when a weak-bit (or a second weak-bit) is included in a long subblock, decoding performance is significantly deteriorated. In the disclosure, a method of determining a set of parity bits (i.e., $\mathcal{PA}$ and $\mathcal{P}$) by considering a relationship between bits in a PC-chain and structural connectivity between PC-chains.

Hereinafter, the method of determining a set of parity bits (i.e., $\mathcal{PA}$ and $\mathcal{P}$) by considering the relationship between the bits in the PC-chain and the structural connectivity between the PC-chains is described in greater detail.

In operation 710, the encoding apparatus may obtain state-indicator information indicating a state of each of bits included in a polar code based on an index set of the bits.

The state-indicator information according to an embodiment of the disclosure may include a state-indicator matrix H, and the state-indicator matrix may indicate a state of each of bit channels in an index matrix I in an encoding process. To describe the state-indicator matrix H in greater detail, parameters required for obtaining the state-indicator matrix by taking a polar code in which a code length is N and the number of information bits is K, as an example.

With respect to the polar code in which the code length is N and the number of information bits is K, an index set (or a sequence or matrix) in which a set of each of bit indices (i; 0≤i≤N−1) is ordered in one order may be defined as I. In addition, sub-sequences $I_j$ (0≤j≤l−1) of the index set (or sequence) may be defined, and the sub-sequences may have mutually exclusive indices, and a union thereof forms I. In other words, $I=\cup I_j$, 0≤j≤l−1, and $I_j$ is a $j^{th}$ sub-set (or sequence or matrix) in I and satisfies $I_j=\{I_{j,0},I_{j,1},\ldots,I_{j,|I_j|}\}$ ($I_{j,0}<I_{j,1}<\ldots<I_{j,|I_j|}$).

In a PC pre-coding process, when $I_{j,k}$ (k∈{0,1,…,|I_j|} is an index corresponding to an information bit, a message bit value of the information bit may be determined independently of other bits. When $I_{j,k}$ is an index corresponding to a parity bit, the parity bit may be encoded as in Equation 4 shown below. In other words, a value of a bit corresponding to the index $I_{j,k}$ may be determined as the binary sum of information bit values, not parity bits.

$$u_{I_{j,k}} = \sum_{t \in I_j, r<k} u_{I_{j,k}} \qquad \text{Equation 4}$$

For example, when N=16, l=5 and sub-sequences are determined as a set of bits having the same remainder obtained by dividing the bits by 5, it may be expressed as $I_0$=[0 5 10 15], $I_1$=[1 6 11], $I_2$=[2 7 12], $I_3$=[3 8 13], $I_4$=[4 9 14]. In an embodiment of the disclosure, a modulo operation may be applied in a sub-grouping process and an encoding process.

A bit having an index of i ($0 \leq i \leq N-1$) belongs to a PC-chain (i mod l), and bits having the same remainder obtained by dividing the bits by l may have an interconnection in the same PC-chain. In other words, the bits having the same remainder may be sub-grouped, and the pre-coding process may be exclusively performed in each PC-chain. In other words, the PC-chain j may be determined through a modulo operation, such as $\{i \in \{0,1, \ldots, N-1\} | (i \bmod l)=j\}$, (l: an integer greater than or equal to 2, $j \in \{0,1, \ldots, l-1\}$). In this case, an index matrix consisting of indices (in an ascending order or ordered) bits in the $j^{th}$ PC-chain may be defined as $I_j(j \in \{0,1, \ldots, l-1\})$, and an index matrix I of a total of N bits with which all PC-chains are concatenated may be expressed as in Equation 5 shown below.

$$I = [I_0^T I_1^T \ldots I_{l-1}^T]^T \qquad \text{Equation 5}$$

When l=5, the index matrix I and an index sub-matrix $I_j(j \in \{0,1, \ldots, l-1\}$ corresponding to each PC-chain may be expressed as in Equation 6 shown below.

$$I = [I_0^T I_1^T I_2^T I_3^T I_4^T]^T \qquad \text{Equation 6}$$

$$I_j = \left[0+j, 5+j, 10+j, \ldots, 5 \times \left\lfloor \frac{N}{5} \right\rfloor + j\right]$$

A code sequence $\mathcal{A}_{code}$ of a polar code is a permutation ordered in a descending order according to reliability of each of bit channels $W_N^{(i)}(i \in \{0,1, \ldots, N-1\})$. The reliability of each bit channel is theoretically evaluated based on channel capacity and Bhattacharyya parameters, and this may be approximately calculated or expressed through various methods, such as density evolution, Gaussian approximation, and polarization reliability.

A code sequence of a polar code obtained by a specific method is indicated by $\mathcal{A}_{code}$. In this case, an index set $\mathcal{A}$ (or sequence or matrix) of (K+f) bits having the highest reliability is $\mathcal{A}_{code}(1: K+f)$. In addition, a minimum value $d_{min}$ of row weights corresponding to bits in the set $\mathcal{A}$ may be expressed as $d_{min}=\min(\{w_N^{(i)}\})$ ($i \in \mathcal{A}$), and $w_N^{(i)}$ indicates a row weight corresponding to an $i^{th}$ bit channel $w_N^{(i)}$ in a generator matrix $$G_N = G_2^{\otimes n}\left(G_2 = \begin{bmatrix} 1 & 0 \\ 1 & 1 \end{bmatrix}, \otimes\right)$$

is a Kronecker product) of a polar code.

In addition, index sets $\mathcal{A}_m^1$ and $\mathcal{A}_m^2$ of bits having a minimum Hamming weight ($d_{min}$) and twice of the minimum Hamming weight from among the bit indices within the set $\mathcal{A}$ may be $\mathcal{A}_m^1=\{i \in \mathcal{A} | w_N^{(i)}=d_{min}\}$, $\mathcal{A}_m^2=\{i \in \mathcal{A} | w_N^{(i)}=2d_{min}\}$, respectively.

Each of elements of the state-indicator matrix H may have a value of 0, 1, 2, 3, and 5, where 0 denotes a state of being finally determined as a parity bit, 1 denotes a state of being determined as an information bit, and 2 and 3 denote a temporary state of being used in a design process. In addition, 5 indicates a default value for bits having an index of N or greater in I. The index matrix I in which N=16 and l=5 may have a form as Equation 7 shown below.

$$I = \begin{pmatrix} 0 & 5 & 10 & 15 \\ 1 & 6 & 11 & 16 \\ 2 & 7 & 12 & 17 \\ 3 & 8 & 13 & 18 \\ 4 & 9 & 14 & 19 \end{pmatrix} \qquad \text{Equation 7}$$

In this case, each of the bits ($i \in \{0, 1, \ldots, 15\}$) is in one state from among an information bit ($\mathcal{A}_{in}$), a bit of parity group 1 ($\mathcal{PA}_c$), and a bit of parity group 2 ($\mathcal{PA}$). First, all of the remaining (N−K−f) bits (set: $\mathcal{A}^c = \mathcal{PA}_c$) that do not belong to the (K+f) bits having the highest reliability may be used as parity bits, and a state thereof is expressed as "0". Bits included in the sets $\mathcal{A}_m^1$ and $\mathcal{A}_m^2$ are expressed as "2" (weak-bit) and "3" (second weak-bit), respectively. In addition, the remaining bits excluding the bit indices in $\mathcal{A}_m^1$ and $\mathcal{A}_m^2$ from among the bits included in the set $\mathcal{A}$ are expressed as "1", and these bits are of a type that is not selected as a parity bit (i.e., a type to be unconditionally selected as an information bit). In this case, some of the bits having "2" or "3" may be determined as parity bits, and as a result, the value thereof may be replaced with "0". Finally, as can be seen in the example of the generator matrix above, bits of which the index is N or greater do not actually exist, and thus, bits corresponding to 16 to 19 are expressed as a default value "$l_{max}$" (e.g., 5). Based on the state described above, a state-indicator matrix H corresponding to each bit may be expressed.

For example, when l=5, a bit of which the index is i is positioned in a ((i mod 5)+1)$^{th}$ row and a ($\lceil i/5 \rceil$)$^{th}$ column in the index matrix I (e.g., a bit of which the index is 13 belongs to a ((13 mod 5)+1)=4)$^{th}$ row and (($\lceil 13/5 \rceil$)=3)$^{th}$ column, and I(4,3)=13), and H may be expressed as in Algorithm 1 shown below.

---

Algorithm 1. Decide H based on index matrix I

0: Initialization: Set all the values in H as $l_{max}$(e.g., 5)
1: for i = 0 : N−1
2:    if i in $\mathcal{A}^c$
3:        $H\left(\bmod(i, 5)+1, \left\lceil \frac{i}{5} \right\rceil\right) = 0$
4:    elseif i in $\mathcal{A}_m^1$
5:        $H\left(\bmod(i, 5)+1, \left\lceil \frac{i}{5} \right\rceil\right) = 2$
6:    elseif i in $\mathcal{A}_m^2$
7:        $H\left(\bmod(i, 5)+1, \left\lceil \frac{i}{5} \right\rceil\right) = 3$

| Algorithm 1. Decide H based on index matrix I |
|---|
| 8:    else |
| 9:       $H\left(\mod(i, 5) + 1, \left\lceil\dfrac{i}{5}\right\rceil\right) = 1$ |
| 10:   endif |
| 11: end |
| 12: Return $H = [H_0^T\ H_1^T\ H_2^T\ H_3^T\ H_4^T]^T$ |

In the disclosure, the state-indicator matrix H determined according to the index matrix I and the code parameter (N, K) may be initialized by Algorithm 1. For example, when N=16 and K+f=8, l=5, $\mathcal{A} = \{7,9,10,11,12,13,14,15\}$, and $\mathcal{A}_m^1 = \{9,10,12\}$, $\mathcal{A}_m^2 = \{7,11,13,14\}$. In addition, H determined based on the above is as in Equation 8 shown below.

$$H = \begin{pmatrix} 0 & 0 & 2 & 1 \\ 0 & 0 & 3 & 5 \\ 0 & 3 & 2 & 5 \\ 0 & 0 & 3 & 5 \\ 0 & 2 & 3 & 5 \end{pmatrix} \quad \text{Equation 8}$$

In Equation 8, 0 indicates a parity bit, 1 indicates an information bit, 5 indicates a default value, and bits having a value other than 0, 1, and 5 may be either information bits ("1") or parity bits ("0"), depending on a parity bit selection method.

In addition, a group of non-zero elements that are continuous for each PC-chain j (j∈ {0,1, . . . , l−1})) may be defined as a "subblock". A $k^{th}$ non-zero subblock in the $j^{th}$ PC-chain is $H_{j,k}$, and a total number of subblocks may be expressed as $n_{H_j}$. For example, when $H_0$=[0 0 1 0 1 2 2 3 0 2 1 1 1], $H_{0,1}$=[1], $H_{0,2}$=[1 2 2 3], $H_{0,3}$=[2 1 1 1], and $n_{H_0}$=3.

In operation 720, the encoding apparatus may identify a weak-bit or a second weak-bit corresponding to a parity bit candidate position preset according to an interconnection within a PC-chain or between PC-chains of a polar code, based on the number of weak-bits determined according to the state-indicator information and the number of bits to be used as parity bits.

The encoding apparatus may use bits that may be vulnerable to errors during SC/SCL decoding as parity bits so that single-parity-check pre-coding may be applied. In this case, the bits vulnerable to errors (weak-bits) are bits that may significantly affect a minimum code distance and the number of codewords having a minimum weight, and mainly have a minimum weight (i.e., $d_{min}$).

The encoding apparatus according to an embodiment of the disclosure apply different various selection methods according to a magnitude relationship between the number (f) of bits to be used as parity bits and the number of weak-bits from among the bits in the set $\mathcal{A}$. For example, when the number of weak-bits is greater than the number (f) of bits to be used as parity bits (i.e., f≤|$\mathcal{A}_m^1$|), it is a matter of selecting f from among all weak-bits, whereas, when the number of weak-bits is less than f, (i.e., f≤|$\mathcal{A}_m^1$|), the matter may be transformed into a problem of selecting all weak-bits and additionally selecting parity bits from among second weak-bits. In an embodiment of the disclosure, an adaptive parity bit selection method for each case is presented.

Hereinafter, four steps of selecting the f bits from among weak-bits when the number of weak-bits is greater than the number (f) of bits to be used as parity bits are described in detail. The four steps to be described below may be sequentially performed, and when the number of selected parity bits reaches f while the steps are in progress, the progress of the steps for selecting parity bits may be terminated.

Step 1. Removal of Unprotected Weak-Bits

A bit having the largest index from among weak-bits in the last subblock (e.g., a group of consecutive non-zero elements positioned at the rearmost in the $j^{th}$ PC-chain, $$H_{j,n_{H_j}})$$

in each PC-chain may be selected as a parity bit. To express the above mathematically, a set of weak-bits in the PC-chain may be individually defined, and an index set $(H_j)_{weak}$ of all weak-bits belonging to the $j^{th}$ PC-chain may be expressed as in Equation 9 shown below.

$$(H_j)_{weak}\{p \in \{1,2, \ldots, \lceil N/l\rceil\} | H_j(1, p) = 2\}$$
$$(j \in \{0,1, \ldots, l-1\}) \quad \text{Equation 9}$$

When $$H_{j,n_{H_j}} (\subset H_j),$$

which is the last sunblock in $H_j$(j∈ {0, 1, . . . , l−1}, includes "2" (i.e., when a weak-bit is present), a bit in an index matrix G corresponding to the rearmost bit in the corresponding subblock may be selected as a parity bit. In other words, an index belonging to $G(j+1, (H_j)_{weak}(|(H_j)_{weak}|))$ corresponding to a $k^{th}$ row and a $(H_j)_{weak}(|(H_j)_{weak}|)^{th}$ column may be selected as a parity bit. This operation may be defined as a RemoveUnprotected(•) function, and in the RemoveUnprotected(•) function, a parity bit selection may be performed according to Algorithm 2 shown below.

| Algorithm 2. (Step 1) RemoveUnprotected(•) |
|---|
| 0:   (Define) $(H_j)_{weak} = \{p \in \{1,2, \ldots, \lceil N/l\rceil\} | H_j(1,p) = 2\}$ |
| 1:   for j = 0 : l − 1 |
| 2:     if '2' in $H_{j,n_{H_j}}$ |
| 3:       $\mathcal{P_A} = \mathcal{P_A} \cup \{G(j+1, (H_j)_{weak}(|(H_j)_{weak}|))\}$ |
| 4:       $H_j(1, \max\{((H_j)_{weak})\} = 0$ |
| 5:     else |
| 6:       $\mathcal{P_A} = \mathcal{P_A}$ |
| 7:     endif |
| 8:   end |
| 9:   Output: $H = [H_0^T\ H_1^T\ \ldots\ H_{l-1}^T]^T, \mathcal{P_A}$ |

In Algorithm 2, $\mathcal{P_A}$ is an index set of parity bits (specifically, bits belonging to parity group 2) and may be continuously updated by a parity bit selection algorithm in a state of being initialized by $\mathcal{P_A} = \emptyset$.

Step 2. Multi Weak-Bit Removal

Step 2 is a process performed after the parity bit selection in Step 1, and a matrix $H = [H_0^T\ H_1^T\ \ldots\ H_{l-1}^T]^T$ ($H_i$ updated by Algorithm 2 may use a row vector and the set $\mathcal{P_A}$. When it is assumed that $u_k$ and $u_{k+l}$ are information bits that are weak-bits, and $u_{k+2l}$ is selected as a parity bit, when an error occurs in both $u_k$ and $u_{k+l}$, $u_{k+2l}(=u_k \oplus u_{k+l})$ may not normally perform a function of a parity bit. Further, when a greater number of weak-bits (i.e., $u_k$, $u_{k+l}$, $u_{k+2l}$ are information bits that are weak-bits, and $u_{k+3l}$ is a parity bit) is not selected as parity bits, an even number of bit errors occur, and thus, a probability that the parity bit cannot function normally increases. Thus, in the disclosure, a bit having low reliability in a subblock including a number of weak-bits may be selected as a parity bit.

In addition, a parity bit may be selected by considering the effect of error propagation. Due to the design characteristics of a polar code, large bit dependency may exist with a $2^t$ (t=0,1, . . . n) spacing. In other words, an error in the $i^{th}$ bit may affect the probability of an error occurring in a $(i+2^t)^{th}$ bit (error propagation). Thus, in Step 2, priority is given to parity bit selection by considering various structures inside/outside the PC-chain.

Figure 8:
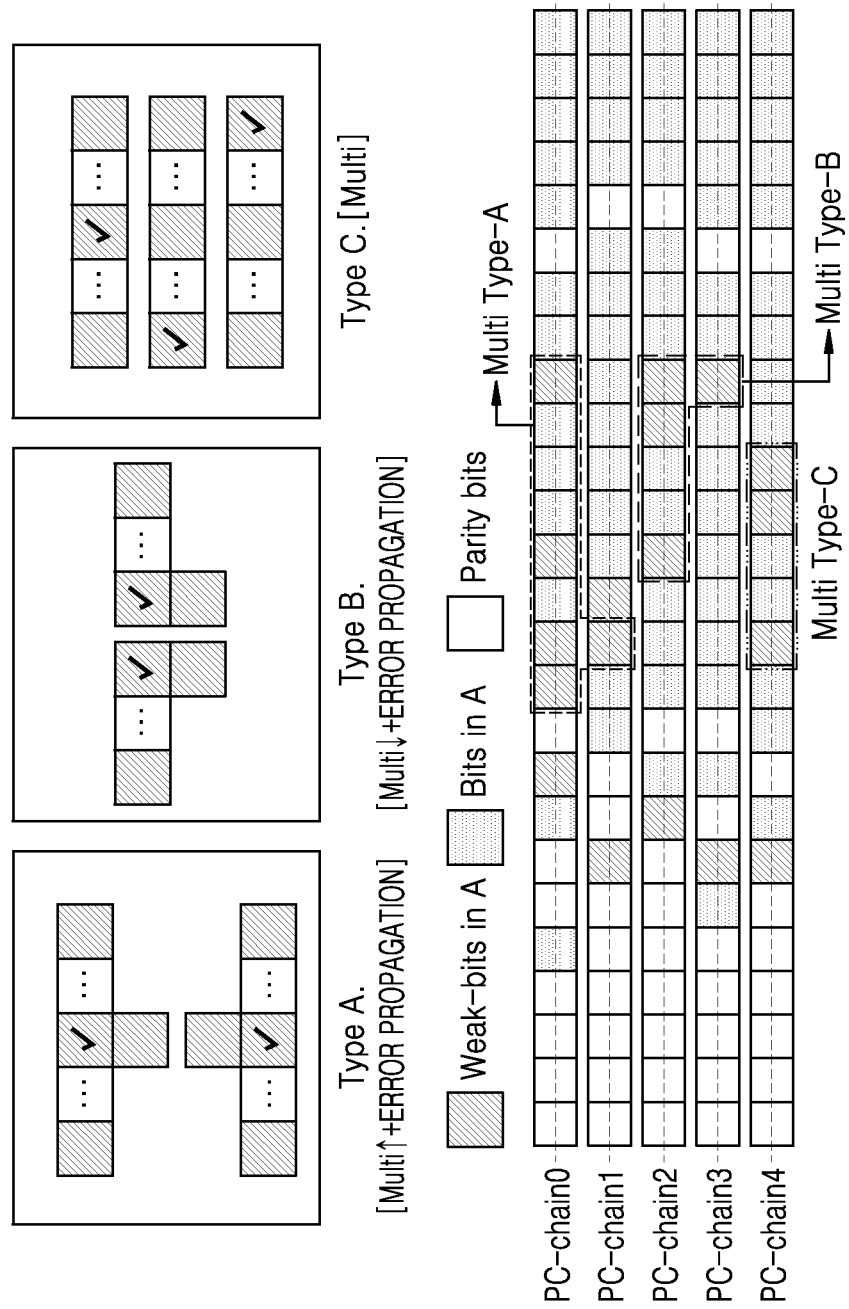
FIG. 8 is a diagram for describing a parity bit selection priority set by considering an internal/external structure of a PC chain, according to an embodiment of the disclosure.

FIG. 8 is a diagram for describing parity bit selection priority set by considering an internal/external structure of a PC-chain, according to an embodiment of the disclosure.

FIG. 8 shows parity bit selection priority for each type, and type A indicates a case in which the number of weak-bits is three or more, and a bit (index i−1 or i+1) neighboring a specific bit is also a weak-bit due to the effect of error propagation. In addition, unlike type A, type B indicates a case in which a bit neighboring bits at both ends in a subblock in terms of a bit index is a weak-bit. In addition, type C indicates a case in which a plurality of weak-bits are included regardless of the effect of error propagation. A bit at an intersection is selected as a parity bit, in order to break a sub-block including a plurality of weak-bits and at the same time mitigate the effect of error propagation, and the selected parity bit candidate is indicated by a "v" mark in FIG. 8.

First of all, the encoding apparatus may search for a parity bit candidate group of type A through Algorithm 3-1 (RemoveMultiA(•) function).

| Algorithm 3-A. (Step2A) RemoveMultiA(•) | | | |
|---|---|---|---|
| 0: | Input: H, $P_A$ (Updated by algorithm 2) | 21: | if H(i,j) = 0 ‖ H(i,j) = 5 |
| 1: | Output: H, $P_A$ | 22: | break; |
| 2: | for $i_0$ = 1, 2, ... , l, $j_0$ = 1,2, ... , ⌈(N − 1)/l⌉ + 1 | 23: | j + + |
| 3: | if H($i_0,j_0$) = 2 | 24: | end |
| 4: | i ← $i_0$, j ← $j_0$ − 1 | 25: | j ← $j_0$ |
| 5: | while (0 < j ‖ j > n) | 26: | if H(i + 1,j) = 2 ‖ H(i −1,j) = 2 |
| 6: | if H(i,j) = 2 | 27: | flag3 = true |
| 7: | flag1 = true | 28: | end |
| 8: | break; | 29: | if flag1 && flag2 && flag3 |
| 9: | end | 30: | H($i_0,j_0$) = 0 |
| 10: | if H(i,j) = 0 | 31: | $P_A = P_A \cup \{(i_0 - 1) + l_{max}(j_0 - 1)\}$ |
| 11: | break; | 32: | end |
| 12: | end | 33: | end |
| 13: | j − | 34: | if f = $|P_A|$ |
| 14: | end | 35: | break; |
| 15: | j ← $j_0$ + 1 | 36: | end |
| 16: | while (0 < j ‖ j > n) | 37: | end |
| 17: | if H(i,j) = 2 | | |
| 18: | flag2 = true | | |
| 19: | break; | | |
| 20: | end | | |

Referring to a pseudo code for Algorithm 3-A and type A shown in FIG. 8, when at least one weak-bit is included at left and right of a specific weak-bit (index: i) from among weak-bits (left subblock search: a pseudo code of Algorithm 3-A, lines 5-15, right subblock search: a pseudo code of Algorithm 3-A, lines 16-25) and at least one bit from among bits (index: i+1 or i−1) neighboring the bit is a weak-bit (a pseudo code of Algorithm 3-A, lines 26-28), the corresponding bit indices may be added as parity bit candidates of type A. In this case, the encoding apparatus may add, to $\mathcal{P}\mathcal{A}$, 1 bit having the lowest reliability from among the parity bit candidates, and then update (i.e., set an element value in the state-indicator matrix H corresponding to the bit selected as a parity bit) H based on $\mathcal{P}\mathcal{A}$. Thereafter, the encoding apparatus may search for another type-A parity bit candidate through a RemoveMultiB(•) function based on the updated H, and when no more type-A parity bit candidate is present, the step may proceed to a RemoveMultiB(•) step.

When $|\mathcal{P}\mathcal{A}|$ updated through the RemoveMultiA(•) function reaches f, no further selection is performed, and the parity selection algorithm may be terminated. When the updated $|\mathcal{P}\mathcal{A}|$ fails to reach f, the encoding apparatus may search for a parity bit candidate group of type B through a RemoveMultiB(•) function of Algorithm 3-B.

| Algorithm 3-B. (Step2B) RemoveMultiB(•) | | | |
|---|---|---|---|
| 0: | Input: H, $P_A$ (Updated by algorithm 2) | 21: | if H(i,j) = 0 ‖ H(i,j) = 5 |
| 1: | Output: H, $P_A$ | 22: | break; |
| 2: | for $i_0$ = 1, 2, ... , l, $j_0$ = 1,2, ... , ⌈(N − 1)/l⌉ + 1 | 23: | j + + |
| 3: | if H($i_0, j_0$) = 2 | 24: | end |

| Algorithm 3-B. (Step2B) RemoveMultiB(•) | |
|---|---|
| 4:     $i \leftarrow i_0, j \leftarrow j_0 - 1$ | 25:     $j \leftarrow j_0$ |
| 5:     while ($0 < j \| j > n$) | 26:     if $H(i + 1, j) = 2 \| H(i - 1, j) = 2$ |
| 6:        if $H(i,j) = 2$ | 27:        flag3 = true |
| 7:           flag1 = true | 28:     end |
| 8:           break; | 29:     if (flag 1 && flag2) \| (flag2 && flag3) |
| 9:        end | 30:        $H(i_0, j_0) = 0$ |
| 10:        if $H(i,j) = 0$ | 31:        $P_A = P_A \cup \{(i_0 - 1) + l_{max}(j_0 - 1)\}$ |
| 11:           break; | 32:     end |
| 12:        end | 33:     end |
| 13:        j − | 34:     if $f = \|P_A\|$ |
| 14:     end | 35:        break; |
| 15:     $j \leftarrow j_0 + 1$ | 36:     end |
| 16:     while ($0 < j \| j > n$) | 37:     end |
| 17:        if $H(i,j) = 2$ | |
| 18:           flag2 = true | |
| 19:           break; | |
| 20:        end | |

Referring to a pseudo code for Algorithm 3-B and type B shown in FIG. 8, when a weak-bit is at one position from among left and right subblocks of a specific bit (a pseudo code of Algorithm 3-B, lines 5-15 and 16-25) and a bit corresponding to the subsequent index is also a weak-bit (a pseudo code of Algorithm 3-B, lines 26-28), a bit at an intersection may be added as a parity bit candidate.

When the number of candidates obtained by using Algorithm 3-B is less than or equal to a value (i.e., $f - |\mathcal{P}\mathcal{A}|$))

The encoding apparatus may update an element value in the state-indicator matrix H corresponding to the bits selected through Algorithm 3-B to 0, and also update $\mathcal{P}\mathcal{A}$.

When $|\mathcal{P}\mathcal{A}|$ updated through a RemoveMultiC(•) function reaches f, no further selection is performed, and the parity bit selection algorithm may be terminated. When the updated $|\mathcal{P}\mathcal{A}|$ fails to reach f, the encoding apparatus may search for a parity bit candidate group of type C through Algorithm 3-C.

| Algorithm 3-C. (Step2C) RemoveMultiC(•) | |
|---|---|
| 0:     Input: H, $P_A$ (Updated by algorithm 2) | 24:     $L_1 = \{L(\text{length}(L))\}$ |
| 1:     Output: H, $P_A$ | 25:     $P_1 = \{P(\text{length}(L)-1\}$ |
| 2:     for $i_0 = 1, 2, \ldots, 1, j_0 = 1, 2, \ldots, \lceil(N - 1)/l\rceil + 1$ | 26:     end |
| 3:        if $H(i_0, j_0) = 2$ | 27:     $N = [B_1^T, L_1^T, P_1^T]^T$ |
| 4:           $B = B \cup \{G(i_0, j_0)\}, S = S \cup$    {weak bit in $B(i_0, j_0)$} | 28:     Sort N by column in descending order w.r.t. $L_1$ |
| 5:           $L = L \cup$    {length( $B(k_0, j_0)$ )}, $P = P \cup$ {PW($G(i_0, j_0)$)} | 29:     $B_2 = P_2 = \emptyset$ |
| 6:        end | 30:     for $j = 1, \ldots, \text{length}(B_1) - 1$ |
| 7:     end | 31:        $B_2 = B_2 \cup \{B_1(j)\}$ |
| 8:     while $f > \|P_A\|$ | 32:        $P_2 = P_2 \cup \{P_1(j)\}$ |
| 9:        Update B, S, L, P if H has changed | 33:        if $L(j) \cong L(j + 1)$ |
| 10:        if $B = \emptyset$ | 34:           break; |
| 11:           break; | 35:        end |
| 12:        end | 36:     end |
| 13:        $M = [B^T, S^T, L^T, P^T]^T$ | 37:     if $B_2 = \emptyset$ |
| 14:        Sort M by column in descending order w.r.t. S | 38:        $B_2 = \{B_1(\text{length}(B_1))\}$ |
| 15:        $B_1 = L_1 = P_1 = \emptyset$ | 39:        $P_2 = \{P_1(\text{length}(P_1))\}$ |
| 16:        for $j = 1, \ldots, \text{length}(B) - 1$ | 40:     end |
| 17:           $B_1 = B_1 \cup \{B(j)\}, L_1 = L_1 \cup \{L(j)\}$ | 41:     $O = [B_2^T P_2^T]^T$ |
| 18:           $P_1 = P_1 \cup \{P(j)\}$ | 42:     Sort O by column in ascending order w.r.t. $P_2$ |
| 19:           if $S(j) \cong S(j + 1)$ | 43:     $P_A = P_A \cup \{B_2(1)\}$ |
| 20:              break; | 44:     $H(B_2(1)\text{mod } l, \lceil B_2(1)/l\rceil) = 0$ |
| 21:           end | 45:     end |
| 22:        if $B_1 = \emptyset$ | |
| 23:           $B_1 = \{B(\text{length}(B))\}$ | | obtained by subtracting a total number of parity bits to be selected by the number of bits selected through Algorithm 2 and Algorithm 3-A, the encoding apparatus may select all of the bits selected by using Algorithm 3-B as parity bits. When the number of candidates obtained by using Algorithm 3-A is greater than the value (i.e., $f - |\mathcal{P}\mathcal{A}|$)) obtained by subtracting the total number of parity bits to be selected by the number of bits selected by using Algorithm 2 and Algorithm 3-A, the encoding apparatus may determine that priority of a bit having low polarization reliability from among the selected candidate bits is high.

The encoding apparatus may search for a type-C parity bit candidate group through the RemoveMultiC(•) function of Algorithm 3-C. When a parity bit offsetting the effect of error propagation and a plurality of weak-bits at the same time is selected through Algorithm 3-A and Algorithm 3-B, in Algorithm 3C, a weak-bit in a subblock including a plurality of weak-bits may be selected as a parity bit.

In this case, priority may be determined in an order of the number of weak-bits in the subblock including weak-bits, a length of the corresponding subblock, and reliability (e.g., polarization weight) of the corresponding bit. First, an index set of bits having "2" in the state-indicator matrix H may be defined as B, and sets of the number of weak-bits in a subblock corresponding to these bits, a length of the subblock, and reliability (e.g., polarization weight) of each of the bits may be defined as S, L, P. In this case, the encoding apparatus may define M having $[B^T, S^T, L^T, P^T]^T$ as a matrix and sort columns of M in descending order. In other words, the encoding apparatus may sort the plurality of weak bits in descending order from the largest number. When the number of weak-bits is the same, the encoding apparatus may locally sort the columns of M in descending order of the length of the subblocks, and may select a bit having the lowest reliability from among them as a parity bit. After performing this parity bit selection process once, $\mathcal{PA}$ and H may be updated.

When the updated $|\mathcal{PA}|$ fails to reach f, the encoding apparatus may perform Step 3 and select an additional parity bit.

Step 3. Minimum Protection Guarantee: Parity Insertion to Each PC Chain

The number of bits selected as parity bits in each PC-chain through Steps 1 and 2 is described as $n_\mathcal{A}(i)$ (i=0,1, . . . , l−1). In this case, when $$\sum_{i=0}^{l-1} n_\mathcal{A}(i) < f$$

(i.e., a predetermined number of parity bits are not yet selected) and $(\exists j) n_\mathcal{A}(j)=0$ is satisfied, the encoding apparatus may select a weak-bit in the $j^{th}$ PC-chain as a parity bit. This is to consider weaknesses of bits in each PC-chain, and to strengthen an overall protection level by selecting at least one weak-bit in each PC-chain as a parity bit.

Because the process of Step 3 is performed when a subblock including a plurality of weak-bits is not present, the greater the length of a subblock including a weak-bit in the corresponding PC-chain, the higher the selection priority, and when lengths of subblocks are the same, the lower the polarization reliability, the higher the selection priority. This may be expressed as Algorithm 4.

| Algorithm 4. (Step 3) GuaranteeMinProtection(•) |
|---|
| 0: Define: $\{H_j\}_{weak}(1)$, $\text{len}(\{H_j\}_{weak}(1))$ |
| 1: for j = 0 : l − 1 |
| 2:   if $n_\mathcal{A}(j) = 0$ |
| 3:     temp1 = $\{H_j\}_{weak}(1)$, temp2 = j |
| 4:     for i = 2 : $|\{H_j\}_{weak}|$ |
| 5:       if $\text{len}(\{H_j\}_{weak}(i)) > \text{len}(temp1)$ |
| 6:         temp1 = $\{H_j\}_{weak}(i)$ |
| 7:       elseif $(\text{len}(\{H_j\}_{weak}(i)) = \text{len}(temp1))$ && $(PW_N^{((\{H_j\}_{weak}(i)-1)*5+l)} < PW_N^{((temp1-1)*5+l)})$ |
| 8:         temp1 = $\{H_j\}_{weak}(i)$ |
| 9:       else |
| 10:         temp = temp |
| 11:       endif |
| 12:     end |
| 13:     endif |
| 14:   end |
| 15:   $\mathcal{P}_{IP} = \mathcal{P}_{IP} \cup \{l \times (temp1 - 1) + j\}$ |
| 16:   UpdateMatrixH($\mathcal{P}_\mathcal{A}$) |

$\{H_j\}_{weak}$ (j∈ {0,1, . . . , l−1}) is an index set of positions of weak-bits in each PC-chain defined as $\{H_j\}_{weak}=\{p \in \{1,2, \ldots, \lceil N/l \rceil\} | H_j(1,p)=2\}$. When it is assumed that a length of a subblock corresponding to a bit at the first position in $\{H_j\}_{weak}$ and polarization reliability (e.g., polarization weight) of the bit are $\text{len}(\{H_j\}_{weak}(1))$ and $PW_N^{(\{H_j\}_{weak}(i)-1)*5+l)}$ ($PW_N^{(i)}$ is a polarization reliability value corresponding to a bit channel having an index of i because an index corresponding to $\{H_j\}_{weak}(i)$ may be expressed as $5*(\{H_j\}_{weak}-1)+l.$), the encoding apparatus may include a subblock having a greater length, or when a bit with the same length of a subblock but lower polarization reliability is found, a parity bit candidate may be changed by changing a value of temp. Through Algorithm 4, a parity bit of at least one bit in all PC-chains may be selected, and the encoding apparatus may perform the Step 3 process and then update the matrix H and an index set $\mathcal{PA}$ (specifically, an index set of parity group 2) of parity bits again.

An UpdateMatrixH(•) function is a function for obtaining H which is updated by a changed parity bit index set, and is shown in Algorithm 5. Meanwhile, the update of H according to Algorithm 5 may be used to update H in each algorithm (for example, Algorithms 1, 2, 3-A, 3-B, and 3-C) in Steps 1 and 2 described above.

| Algorithm 5. UpdateMatrixH(•) |
|---|
| 0:         Input: $\mathcal{P}_\mathcal{A}$ |
| 1:         for i = 1 : $|\mathcal{P}_\mathcal{A}|$ |
| 2:         $H((\mathcal{P}_\mathcal{A}(i) \bmod l) + 1, \lfloor \mathcal{P}_\mathcal{A}(i)/5 \rfloor + 1) = 0$ |
| 3:         end |
| 4:         Output: H |

When the updated $|\mathcal{PA}|$ fails to reach f, the encoding apparatus may perform Step 4 and select an additional parity bit.

Step 4. Error Propagation Mitigation

When the number of parity bits selected through Steps 1 to 3 is still less than f, the encoding apparatus may select an additional parity bit by using Algorithm 6 in the process of Step 4.

| Algorithm 6. (Step 4) MitigateErProp(·) |
|---|
| 0: for i = 0 : N−1 |
| 1:   if $H\left((i \bmod 5) + 1, \left\lceil \frac{i+1}{5} \right\rceil\right) = H\left(((i+1) \bmod 5) + 1, \left\lceil \frac{(i+1)+1}{5} \right\rceil\right) = 2$ |
| 2:     temp = temp $\cup$ {i} |
| 3:     $PW_{temp} = PW_{temp} \cup \{PW_N^{(i)}\}$ |
| 4:   endif |
| 5: end |
| 6: [$PW_{temp}$ index] = sort($PW_{temp}$, 'descend') |
| 7: $\mathcal{P}_{IP} = \mathcal{P}_{IP} \cup \{temp(index(1)), \ldots, temp(index(A))\}$ |
| 8: Output: $\mathcal{P}_{IP}$ |

When a bit having an index of i and a bit having an index is (i+1) are all weak-bits, the encoding apparatus may select the bit i as a parity bit in order to reduce the effect of error propagation. When $$H\left((i \bmod 5) + 1, \left\lceil \frac{i+1}{5} \right\rceil\right)$$

(i.e., an element value in the state-indicator matrix H corresponding to a bit having an index of $i(0 \le i \le N-1))$ and $H\left(((i+1) \bmod 5)+1, \left\lceil \frac{(i+1)+1}{5} \right\rceil\right)$ (i.e., an element value in the state-indicator matrix H corresponding to a bit having an index of (i+1) have the same value of "2" (i.e., weak-bit), temp and $PW_{temp}$ may be an index set of bits having an index of i and a polarization reliability set of the bits having the index of i, respectively. The encoding apparatus may select a bit corresponding to the lowest value side of $PW_{temp}$ as a parity bit. For example, when A bits in Step 4 are selected as parity bits, the encoding apparatus may select bits corresponding to A values having the lowest polarization reliability. Algorithm 6 described above may be defined through a MitigateErProp(•) function.

When the number (i.e., $|\mathcal{A}_m^1|$) of bits (i.e., weak-bits) having a minimum weight in the set $\mathcal{A}$ is greater than the number (f) of parity bits to be selected, the encoding apparatus according to an embodiment may sequentially apply Steps 1 to 4 above, to perform a parity bit selection. When the number of selected parity bits reaches the number (f) of parity bits to be selected by the encoding apparatus in a process of sequentially applying Steps 1 to 4, the encoding apparatus may terminate selection of parity bits. Hereinafter, a method of selecting a parity bit by sequentially applying Algorithm 7 to Steps 1 to 4 is described.

Example 1

Parity Bit Selection Method When $f \le |\mathcal{A}_m^1|$

When the number (i.e., $|\mathcal{A}_m^1|$) of bits (i.e. weak-bits) having a minimum weight in the set $\mathcal{A}$ is greater than the number (f) of parity bits to be selected, the encoding apparatus may select f out of the $|\mathcal{A}_m^1|$ weak-bits may be selected based on Algorithm 7.

encoding apparatus may update H based on index information of the bits corresponding to $\mathcal{P}\mathcal{A}$.

When the number of bits selected through the RemoveUnprotected(•) function (lines: 2-4) fails to reach f, the encoding apparatus may search for a candidate for bits which are included in a subblock having a plurality of weak-bits and are structurally interconnected with the effect of error propagation through the RemoveMultiA(•) function (lines: 5-7) of case 2, and add bits corresponding to some or all of the candidates to $\mathcal{P}\mathcal{A}$ according to a condition. When the number of bits selected up to case 2 reaches f, the encoding apparatus may stop updating of $\mathcal{P}\mathcal{A}$ and H and terminate all parity bit selection algorithms.

When the number of selected parity bits fails to reach f, the encoding apparatus may ultimately select f parity bits through functions of case 3 (RemoveMultiB(•), a pseudo code of Algorithm 7, lines: 8-10), case 4 (RemoveMultiC(•), a pseudo code of Algorithm 7, lines 11-13), case 5 (GuaranteeMinProtection(•), a pseudo code of Algorithm 7, lines: 14-16), and case 6 (MitigateErProp(•), a pseudo code of Algorithm 7, lines: 17-19) functions.

Example 2

Parity Bit Selection Method When $f > |\mathcal{A}_m^1|$

When the number (i.e., $|\mathcal{A}_m^1|$) of bits (i.e., weak bits) having a minimum weight in the set $\mathcal{A}$ is less than the number (f) of parity bits to be selected, the encoding apparatus may select a total of $|\mathcal{A}_m^1|$ weak-bits and further select k ($0 < k \le f - |\mathcal{A}_m^1|$) second weak-bits. In this case, the encoding apparatus may select k second weak-bits based on Algorithm 8-1 and Algorithm 8-2.

Algorithm 7. Parity Selection Algorithm ($f \le |\mathcal{A}_m|$)

```
0:   while (|𝒫_𝒜| < f){
1:     switch (type) {
2:       case 1: 𝒫_𝒜 ← 𝒫_𝒜 ∪ RemoveUnprotected(•)    //Removal of
3:         H ← UpdateMatrixH(𝒫_𝒜)                       unprotected
4:         break;                                       weak-bits
5:       case 2: 𝒫_𝒜 ← 𝒫_𝒜 ∪ RemoveMultiA(•)         // Removal of
6:         H ← UpdateMatrixH(𝒫_𝒜)                      multi type-A
7:         break;
8:       case 3: 𝒫_𝒜 ← 𝒫_𝒜 ∪ RemoveMultiB(•)         // Removal of
9:         H ← UpdateMatrixH(𝒫_𝒜)                      multi type-B
10:        break;
11:      case 4: 𝒫_𝒜 ← 𝒫_𝒜 ∪ RemoveMultiC(•)         // Removal of
12:        H ← UpdateMatrixH(𝒫_𝒜)                      multi type-C
13:        break;
14:      case 5: 𝒫_𝒜 ← 𝒫_𝒜 ∪ GuaranteeMinProtection(•) // Minimum
15:        H ← UpdateMatrixH(𝒫_𝒜)                      protection
16:        break;                                       guarantee
17:      case 6: 𝒫_𝒜 ← 𝒫_𝒜 ∪ MitigateErProp(•)       // Error-propagation
18:        H ← UpdateMatrixH(𝒫_𝒜)                      mitigation
19:        break; }
20:    type += 1 }
```

Referring to Algorithm 7 shown above, the encoding apparatus may first initialize the index set $\mathcal{P}\mathcal{A}$ of parity bits to be selected to $\mathcal{P}\mathcal{A} = \emptyset$, and update $\mathcal{P}\mathcal{A}$ and the state-indicator matrix H according to the steps described above. Specifically, the encoding apparatus may add, to $\mathcal{P}\mathcal{A}$ via the RemoveUnprotected(•) function of Step 1, a bit having the largest index from among bits having a weak-bit in the last subblock for each PC-chain. In addition, the Algorithm 8-1. Parity Selection Algorithm ($f > |\mathcal{A}_m|$)

```
0:   Input: N, K, f
1:   Output: f₁, f₂, f₃
2:   f₁ = |𝒜_m|, f₂ = ⌊0.75 (f − |𝒜_m|)⌋
3:   if ⌊0.75 (f − |𝒜_m|)⌋ ≠ 0
4:     if (# of multi-weak bit subblock) > 0
```

-continued

Algorithm 8-1. Parity Selection Algorithm ($f > |\mathcal{A}_m^1|$)

```
 5:             f₃ = 1
 6:        else
 7:             f₃ = 0
 8:        end
 9:     else
10:        f₃ = 0
11:     end
```

First, the encoding apparatus may select all weak-bits (the number of weak-bits: $f_1(=|\mathcal{A}_m^1|)$). In addition, the encoding apparatus may select $f_2=\lfloor 0.75(f-f_1) \rfloor$ bits for the purpose of unprotected bit selection, and then, when $f_2 \neq 0$ or when there is a subblock including multiple second weak-bits from the updated H, further select only one second weak-bit.

When $f > |\mathcal{A}_m^1|$, Algorithm 8-2 shown below shows a parity bit selection method based on V metric.

Algorithm 8-2. UpdateCaleVMetric(•)

```
 0:  Input: H, P_A                              21:     if G(i₀,j) = 0
 1:  C = ∅                                      22:         temp = ∅
 2:  for i₀ = 1, 2, .... , l                    23:         break
 3:     temp = V = P = A = ∅                    24:     end
 4:     for j₀ = 1,2, ... , ⌈(N − 1)/l⌉ + 1     25:     l₂ = j − 1 − j₀
 5:        num=0                                26:     v = |l₁ − l₂|
 6:        if H(i₀,j₀) = 3                      27:     if l₁ ! = 0
 7:           j = j₀ − 1                        28:        temp = temp ∪ {G(i₀,j₀)}, V = V ∪ {v}
 8:           while G(i₀,f) ! = 0               29:        A = A ∪ {temp}, P=P∪{PW(G(i₀,j₀))}
 9:              if H(i₀,f) = 3                 30:     end                         //Type-A multi
10:                 num++                       31:     end                             weak-bit search
11:              end                            32: end
12:              j−−                            33: M = [temp^T, V^T, A^T, P^T]^T      //Type-B multi
13:           end                               34: Sort M by column in increasing order w.r.t.V  weak-bit search
14:           l₁ = j₀ − (j + 1), j = j₀ + 1     35: C = C ∪ {M(1)}
15:           while G(i₀,j) < N ∥ G(i₀,j) ! = 0 36: end                                 //Type-C multi
16:              if H(i₀,j) = 3                 37: if f₂ > |temp|                        weak-bit search
17:                 num++                       38:     P_A = P_A ∪ C, UpdateMatrixH(P_A)
18:              end                            39: else
19:              j++                            40:     Sort C by column in descending order w.r.t.A
20:                                             41:     Partition C where different values of A appears: C =
                                                        [C₁, C₂, ... , C_k]
                                                42:     Sort C₁, C₂, ... , C_k each by column in ascending order w.r.t.P
                                                43:     P_A = P_A ∪ C[1][1: f₂], UpdateMatrxH(P_A)
                                                44: end
```

With respect to each of PC-chains (PC-chain i: $0 \leq i \leq l-1$), the encoding apparatus may analyze profiles of second weak-bits in the rearmost subblock $$\left(\text{i.e., } H_{i,n_{H_i}}\right).$$

First, the encoding apparatus may store all bit indices corresponding to the second weak-bits in $$H_{i,n_{H_i}}$$

in a space of $(temp1)_i$ ($0 \leq i \leq l-1$). Thereafter, the encoding apparatus may identify a second weak-bit other than a second weak-bit positioned first from among at least one second weak-bit. In other words, the encoding apparatus may exclude all bits in which a value of $l_1$ corresponding to each second weak-bit is 0 (i.e., $(temp1)_i = (temp1)_i \backslash \{bit with l_1=0\}$). When there is a number of second weak-bits in $(temp1)_i$ updated through the process described above, the encoding apparatus may determine a second weak-bit having the lowest V metric value ($V=|l_1-l_2|$) as a parity bit, in order to divide a distribution of weak-bits in the subblock as evenly as possible. The V metric may be a balancing parameter which is determined based on positions of second weak-bits in a subblock. When this process is performed, a maximum of 1 bit remains in each $(temp1)_i$, and the encoding apparatus may store an index union of these bits in temp1 ($(temp1=\cup(temp1)_i)$).

However, priorities may also exist for these bits. Accordingly, the encoding apparatus may give higher priority as the number of second weak-bits in a subblock to which the second weak-bits included in the set temp1 belong increases, and when the number of second weak-bits in the subblock is the same, higher priority is given to a bit having lower reliability. For example, when the numbers of second weak-bits in a subblock including second weak-bits respectively having indices are a, b, and c are d, d, and e (d<e), respectively and the polarization reliability thereof are f, g, and h (f<g), respectively, priority may be determined as c, a, and b.

When the number of bits selected through the process described above is greater than or equal to $f_2$, bits having an index of $temp1(1:f_2)$ may be selected as parity bits (a pseudo code of Algorithm 8-2, lines 39-44). On the other hand, when the number of selected bits is less than $f_2$, all bits in temp1 are selected as parity bits, and the process proceeds to the next step (a pseudo code of Algorithm 8-2, lines 37-38).

This time, the encoding apparatus may analyze profiles of second weak-bits in a subblock $$\left(\text{i.e., } H_{i,n_{H_i}-1}\right)$$

which is second to last. This may be performed in a similar manner to Algorithm 8-2. Similar to the above, the encoding apparatus may store all bit indices corresponding to the second weak-bits in $$H_{i,n_{H_i}-1}$$

in the space of (temp2)$_i$ (0≤i≤l−1). Thereafter, the encoding apparatus may exclude all bits in which the value of $l_1$ corresponding to each of the second weak-bits is 0 (i.e., (temp2)$_i$=(temp2)$_i$\{bit with $l_1$=0}). When there are a number of second weak-bits in (temp2)$_i$ updated through this process, the encoding apparatus may determine a bit having the largest index as a parity bit. When the process is performed, a maximum of 1 bit remains in (temp2)$_i$, and the encoding apparatus may store an index union of these bits in (temp2) ((temp2)=∪(temp2)$_i$).

Priority is also given to these bits, and thus, higher priority may be given as the number of second weak-bits in each subblock to which each of the second weak-bits in (temp2) belong increases, and when the number of second weak-bits in each of the subblock is the same, higher priority is given to a second weak bit, in (temp2), having lower reliability. When the number of bits selected through the process above is greater than or equal to (f$_2$−|temp1|), the encoding apparatus may bits having an index of temp2(1:f$_2$−|temp1|) as parity bits. On the other hand, when less than (f$_2$−temp1), the encoding apparatus may select all bits in (temp2) as parity bits and proceeds to the next step.

When (f$_2$−|temp1|−|temp2|) is still greater than 0, the encoding apparatus goes back to the rearmost subblock $$\left(\text{i.e., } H_{i,n_{H_j}}\right)$$

and sequentially select (f$_2$−|temp1|−|temp2|) bits from the bits having the lowest reliability from among second weak-bits in each PC-chain, so as to terminate selection of f$_2$ bits. An element value in the state-indicator matrix H corresponding to parity bits selected through the process described as may be updated to 0, and the parity bit index set $\mathcal{PA}$ may be updated.

Lastly, in a case in which f$_2$≠0 as indicated in Algorithm 8-1 and one or more subblocks including a number of second weak-bits remain, the RemoveMultiA(•), RemoveMultiB(•), and RemoveMultiC(•) functions may be sequentially applied, and when 1 bit is selected, the encoding apparatus may terminate a process of selecting a parity bit from among the second weak-bits.

Referring to FIG. 7 again, in operation 730, when the number of parity bits identified corresponds to the number of bits to be used as parity bits according to an interconnection within a PC-chain of a polar code and between PC-chains of the polar code, the encoding apparatus may terminate identification of a weak-bit or a second weak-bit as a parity bit. As in each of Algorithms 1 to 8-2 described above, in a process of selecting parity bits, when the number of selected parity bits reaches the number (f) of parity bits to be selected, the encoding apparatus may terminate an identification process of a weak-bit or a second weak-bit as a parity bit.

In operation 740, the encoding apparatus may obtain a polar code including the identified parity bit. The encoding apparatus may transmit a signal including the obtained polar code to a decoding apparatus. Meanwhile, before transmitting the obtained polar code, the encoding apparatus may transmit, to the decoding apparatus, information about the selected parity bit or an index of the selected parity bit. According to another embodiment, the encoding apparatus may transmit, to the decoding apparatus, information about the selected parity bit or an index of the selected parity bit together with the obtained polar code.

Figure 9:
FIG. 9 is a diagram for describing a parity bit selection process according to an embodiment of the disclosure.

FIG. 9 is a diagram for describing a parity bit selection process according to an embodiment of the disclosure.

Referring to FIG. 9, because f=7 and $|\mathcal{A}_m^1|$=13 in a (128,34) code, an index set $\mathcal{PA}$ of seven parity bits from among 13 weak-bits may be determined. For convenience of explanation, an index set of parity bits selected through Algorithm 2 is defined as $\mathcal{P}_1$ (by a RemoveUnprotected(•) function), an index set of parity bits selected through Algorithms 3A, 3B, and 3C is defined as $\mathcal{P}_2$ (by RemoveMultiA (•), RemoveMultiB(•), RemoveMultiC(•) functions), and index sets of parity bits selected through Algorithms 4 and 6 are defined as $\mathcal{P}_3$ (by a GuaranteeMinProtection(•) function) and $\mathcal{P}_4$ (by a MitigateErProp(•) function), respectively.

First, the encoding apparatus may select a weak-bit having the largest index in the rearmost subblock of each PC-chain as a parity bit, through Step 1. In other words, the encoding apparatus may select a bit having an index of 120 in PC-chain 0, having an index of 116 in PC-chain 1, having an index of 113 in PC-chain 3, and having an index of 114 in PC-chain 4 as a parity bit. In PC-chain 2, a weak-bit is not present in the last subblock, and thus, PC-chain 2 is not selected. Consequently, an index set $\mathcal{P}_1$ of parity bits selected through Step 1 is $\mathcal{P}_1$={120,116,114,113}, and the encoding apparatus may update an element value in the state-indicator matrix H corresponding to the corresponding bits may be updated to "0". (Up to present, $\mathcal{PA}$ = $\mathcal{P}_1$={120,116,114,113}).

Next, the encoding apparatus may determine a parity bit set through Step 2 by using the updated state-indicator matrix H. Referring to FIG. 9, there is no subblock of type A in an index set, but a plurality of weak-bits and a bit of which the index at an intersection in terms of the effect of error propagation is "101" may be further selected through the RemoveMultiB(•) function for identifying a parity bit of type B (has one structure of type-B in which (2,21)=H(3, 21)=H(2,22)=2). In other words, $\mathcal{P}_2$={101}, and a value of H(2,21) corresponding to that bit may be updated to 0. (Up to present, $\mathcal{PA} = \mathcal{P}_1 \cup \mathcal{P}_2$={120,116,114,113,101}).

When the number of parity bits selected up to present fails to reach the number of parity bits to be used, the encoding apparatus may further select a parity bit through Step 3. In Step 3, "102" of PC-chain 2 in which not a single weak-bit is selected may be selected as a parity bit in terms of overall protection-level enhancement of each of the PC-chains. A subblock including 92 and 102 have the same length of 2, and 102 having lower polarization reliability may be selected as a parity bit, and $\mathcal{P}_3$={102}. The encoding apparatus may update a value of H(3,21) corresponding to a bit having an index of 102 to 0 (i.e., $\mathcal{PA} = \mathcal{P}_1 \cup \mathcal{P}_2 \cup \mathcal{P}_3$={120,116,114,113,101,102}).

Because the number of bits selected up to present is 6, the encoding apparatus may apply a parity bit selection method (i.e., Step 4) considering the effect of error propagation according Step 4 may be applied. From among a structure where an index is 89-90 (H(5,18)=H(1,18)=2 in the matrix H) and a structure where an index is 105-106 (H(1,21)=H (2,22)=2 within the matrix H), the encoding apparatus may select 89 having lower polarization reliability as a parity bit. In other words, $\mathcal{P}_4$={89} ($\mathcal{PA} = \mathcal{P}_1 \cup \mathcal{P}_2 \cup \mathcal{P}_3 \cup \mathcal{P}_4$={120,116,114,113,101,102,89}). In the related art in which polarization reliability is used as the only parity bit selection criterion, an index set $\mathcal{PA}$ of selected parity bits is {120,116,114,108,113,106,92}. Parity bit selection according to the disclosure and parity bit selection according to the related art have 3 bit difference. However, as a result of simulation, it may be identified a performance gain of 0.15 dB occurs in terms of SNR [dB] satisfying a BLER=$10^{-3}$.

Figure 10:
FIG. 10 is a diagram for describing a parity bit selection process according to an embodiment of the disclosure.

FIG. 10 is a diagram for describing a parity bit selection process according to an embodiment of the disclosure.

Referring to FIG. 10, when f=7 and $|\mathcal{A}_m^1|$=14 in a (128,70) polar code, seven parity bits from among 14 weak-bit parity bit candidates may be selected.

The encoding apparatus may select a weak-bit having the largest index in the last subblock in each PC-chain as a parity bit through the RemoveUnprotected(•) function. In other words, the encoding apparatus may select indices "100" in PC-chain 0, "112" in PC-chain 2, "98" in PC-chain 3, and "104" in PC-chain, and accordingly, $\mathcal{P}_1$={112,104,100,98} (Up to present, $\mathcal{PA} = \mathcal{P}_1$={112,104,100,98}).

In addition, the encoding apparatus may select weak-bits in a subblock including a plurality of weak-bits through Step 2. The encoding apparatus may select, through the RemoveMultiB(•) function, 81 at an intersection in a structure in which indices are 76-81-82 (H(2,16)=H(2,17)=H(3,17)=2), and update a value of H(2,17) to 0. Thereafter, a structure including 82-97 and 74-84 remains in the index set. The encoding apparatus may select a bit having lower polarization reliability in each subblock as a parity bit through the RemoveMultiC(•) function, and through this, 82 and 74 may be selected as parity bits. (Up to present, $\mathcal{PA} = \mathcal{P}_1 \cup \mathcal{P}_2$={112,104,100,98,82,81,74}).

An index set $\mathcal{PA}$ of parity bits selected through Steps 1 and 2 is $\mathcal{PA} = \mathcal{P}_1 \cup \mathcal{P}_2$={112,104,100,98,81,82,74}, and when the number of selected parity bits reaches the number (f=7) of parity bits to be used by the encoding apparatus, the encoding apparatus may terminate a step for selecting a parity bit. Meanwhile, the index set $\mathcal{PA}$ of parity bits selected according to the related art is {112,104,100,88,98, 84,97}. Parity bit selection according to the disclosure and parity bit selection according to the related art results in a 3 bit difference. However, as a result of simulation, a performance gain of 0.13 dB occurs in terms of SNR [dB] achieving a BLER of $10^{-3}$.

Figure 11:
FIG. 11 is a diagram for describing a parity bit selection process according to an embodiment of the disclosure.

FIG. 11 is a diagram for describing a parity bit selection process according to an embodiment of the disclosure.

Referring to FIG. 11, because f=7 and $|\mathcal{A}_m^1|$=1 in a (128,40) polar code, the encoding apparatus may select one weak-bit (i.e., a bit having a minimum weight) as a parity bit, and further select $\lfloor 0.75(f-|\mathcal{A}_m^1|) \rfloor$ out of second weak-bits as parity bits.

First, the encoding apparatus may select all weak-bits in the set $\mathcal{A}$ ($\mathcal{P}_0$={112}).

Next, the encoding apparatus may store, in (temp1)$_i$, bits having the lowest V metric where $l_1$ is not zero, from among second weak-bits in the last subblock $$H_{l,n_{H_l}}$$

in each PC-chain. Indices of the stored bits are "120" in PC-chain 1, "116" in PC-chain 2, "113" in PC-chain 3, and "114" in PC-chain 4. In "102" in PC-chain 2, V=0, and thus, "102" in PC-chain 2 may not be selected. An index union of these bits is (temp1)={120,116,114,113}, and priority determined by considering the number of second weak-bits in a subblock including the corresponding bits and polarization reliability of each of the bits is as in (temp1)←sort ((temp1))={116, 113, 120, 114}. Because $f_2$=|temp1|, the encoding apparatus may select all second weak-bits included in (temp1) as parity bits.

When $\lfloor 0.75(f-|\mathcal{A}_m^1|) \rfloor \neq 0$ and a subblock including a plurality of weak-bits remains even after the second weak-bit selection process described above, the encoding apparatus may further select one bit in a subblock including a plurality of second weak-bits.

A second weak-bit satisfying a condition in the RemoveMultiA(•) function does not exist. However, second weak-bit candidates satisfying a condition in the RemoveMultiB(•) function exist, and accordingly, "85" having the lowest polarization reliability from among the second weak-bit candidates satisfying the condition in the RemoveMultiB(•) function may be added to $\mathcal{PA}$. In other words, the index set $\mathcal{PA}$ of parity bits within group 1 selected in the embodiment of FIG. 11 is $\mathcal{PA}$={112,120,116,114,113,85}.

Figure 12A:
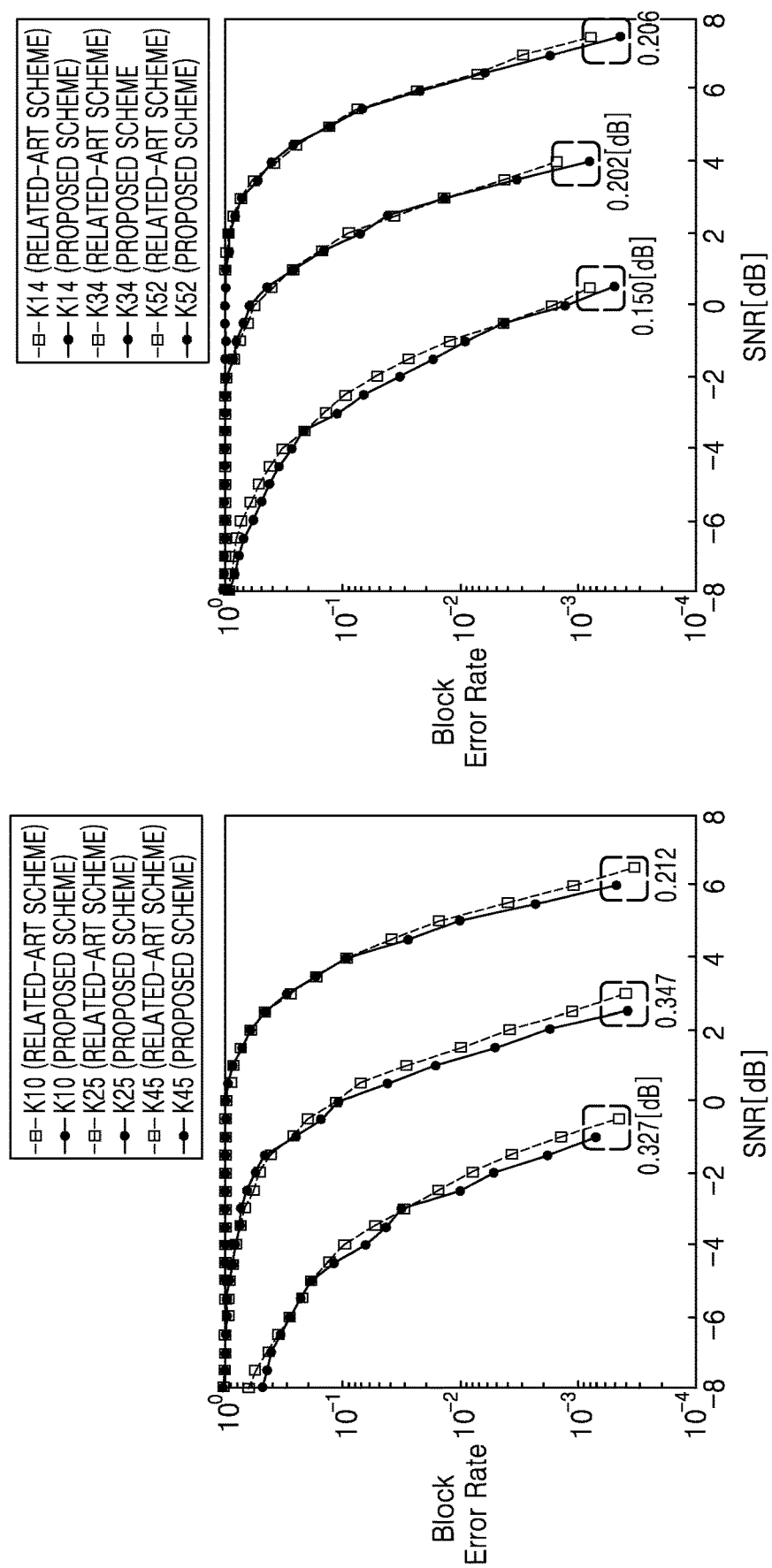
FIG. 12A is a graph showing a block error rate (BLER) for each encoding parameter of a polar code including identified parity bits according to an embodiment of the disclosure.

FIG. 12A is a graph of a BLER for each encoding parameter of a polar code including identified parity bits according to an embodiment of the disclosure.

FIG. 12A is a graph of a result of performing a 1-bit fine granularity simulation on a code length N=64, and is assumed that quadrature phase shift keying (QPSK) modulation and additive white Gaussian noise (AWGN) channel are used in the simulation. In addition, SCL decoding of which the list size is 8.

FIG. 12A is a graph of comparison between a case of selecting a parity bit according to the related art and a case of selecting a parity bit according to the disclosure, when N=64 for various encoding parameters. Because an error rate area of interest is BLER=$10^{-3}$, as a result of identifying an SNR [dB] achieving BLER=$10^{-3}$, it can be identified that error rate performance of a case of selecting a parity bit according to the disclosure is always excellent compared to the related art and has a performance gain of 0.15-0.35 dB.

Figure 12B:
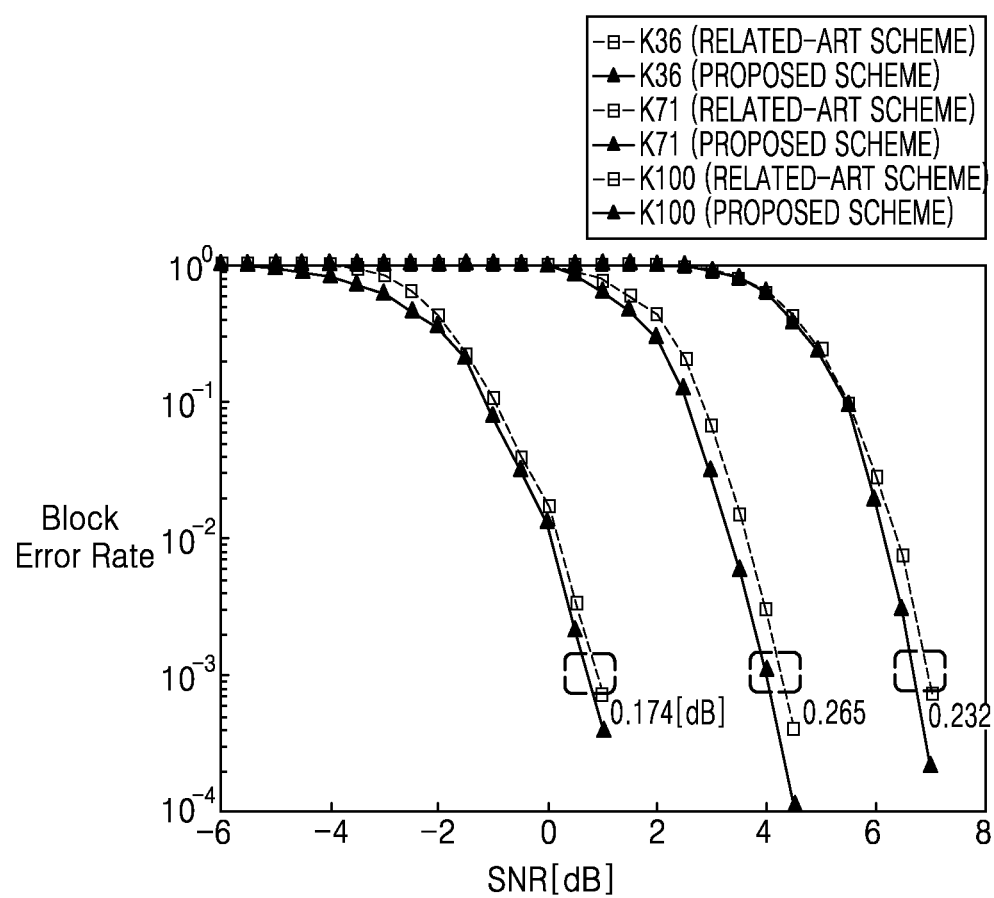
FIG. 12B is a graph showing a BLER for each encoding parameter of a polar code including identified parity bits according to an embodiment of the disclosure.

FIG. 12B is a graph of a BLER for each encoding parameter of a polar code including identified parity bits according to an embodiment of the disclosure.

FIG. 12B is a graph of comparison between the decoding performances of a parity selection method according to the related art and a parity selection method according to the disclosure, with respect to a cyclic redundancy check (CRC)-PC polar code with which a 6-bit CRC code is concatenated, when N=128 and K=36, 71, 100. In the simulation, in both schemes, a magnitude relationship between the number of weak-bits in (K+$n_{CRC}$+f) ($n_{CRC}$: number of CRC bits) bits having the highest reliability and f, and then, different parity bit selection methods are applied. As a result of simulation, in the corresponding parameter, it is identified that a performance gain effect is larger when the parity bit selection method according to the disclosure is applied, compared to the related-art parity bit selection method. Through this, because CRC is concatenated with an end of an information block, it can be identified that a performance gain obtained by selecting weak-bits of an earlier index as parity bits is large.

Figure 12C:
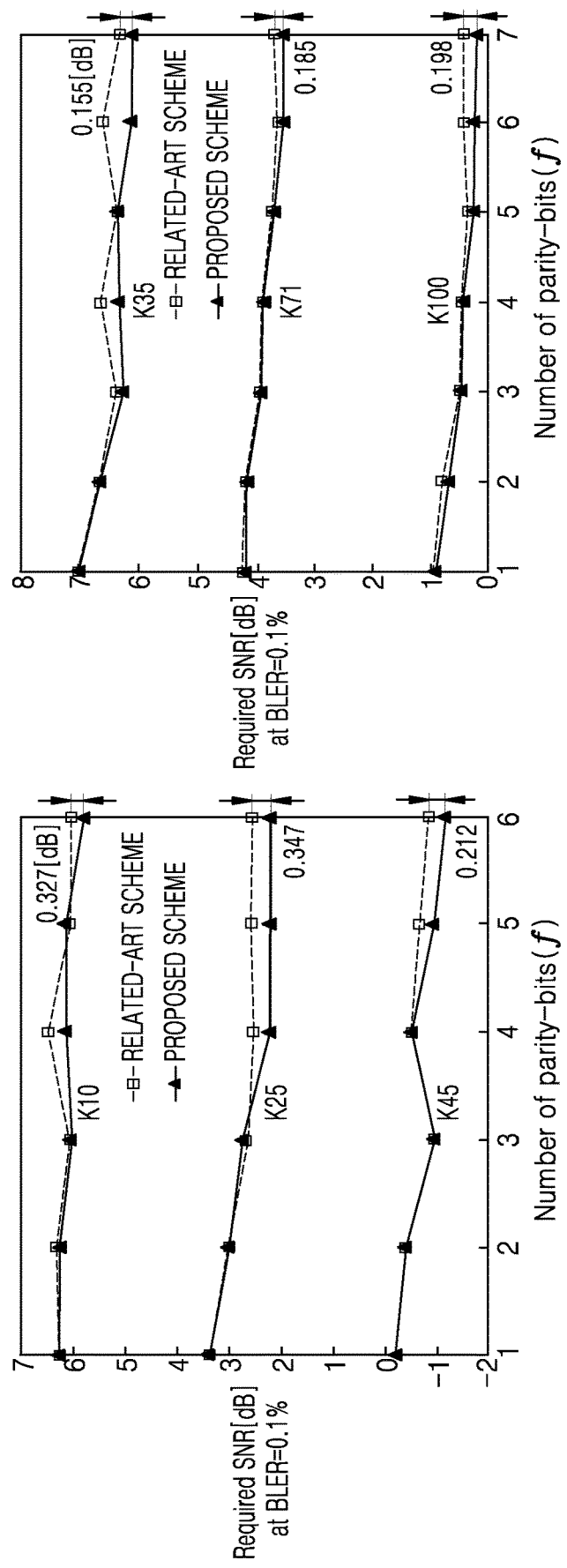
FIG. 12C is a graph showing a required signal-to-noise ratio (SNR) [dB] according to the number of parity bits of a polar code including identified parity bits according to an embodiment of the disclosure.

FIG. 12C is a graph of an SNR [dB] according to the number of parity bits of a polar code including identified parity bits according to an embodiment of the disclosure.

FIG. 12C is a graph of comparison between required SNRs [dB] achieving BLER=$10^{-3}$ according to the number of parity bits. In FIG. 12C, the left graph is a case in which N=64, and the second graph is a case in which N=128, and a simulation is performed on a PC polar code in which a CRC code is not considered.

Referring to the graph of FIG. 12C, unlike the performance of the parity selection method according to the related art, the number of parity bits is large when the parity selection method according to the disclosure is applied, and thus, it may be identified that a target BLER may be achieved with an overall lower required SNR.

Figure 13:
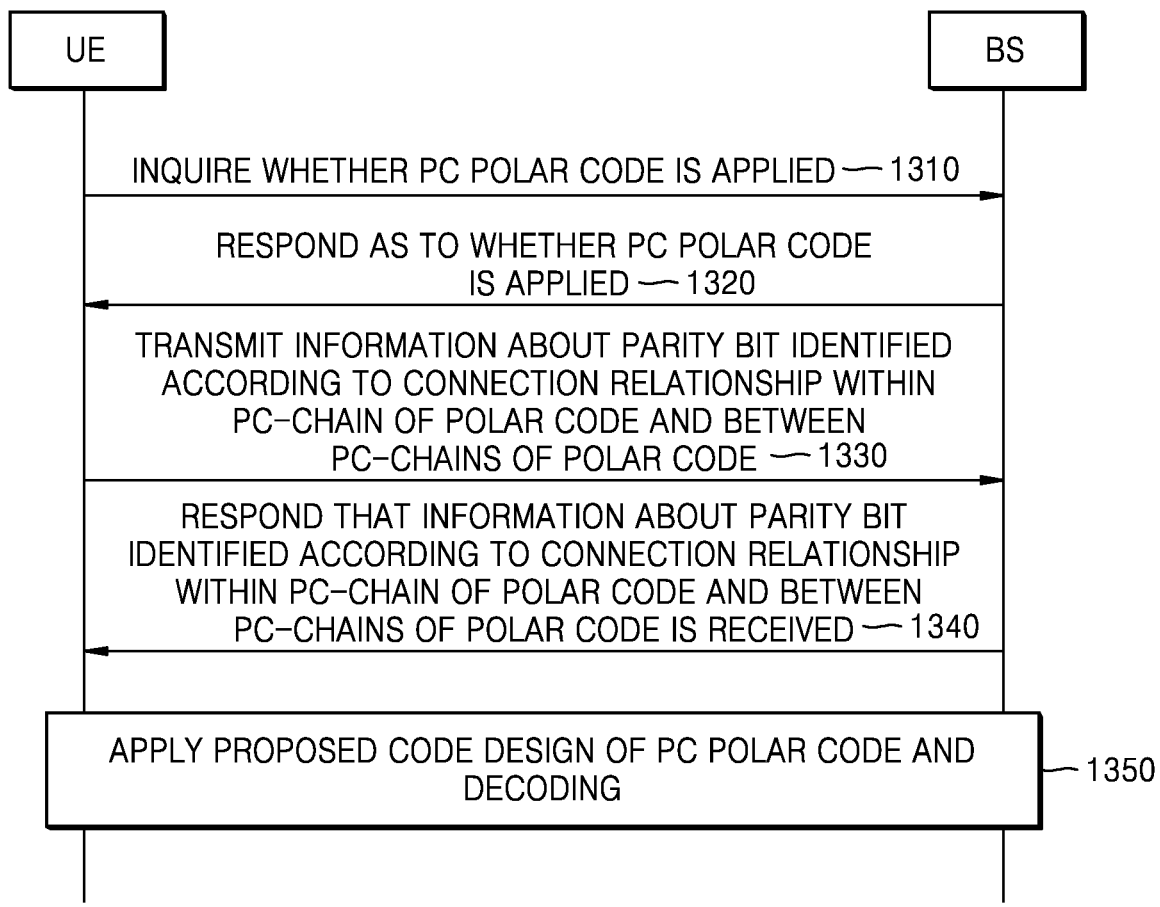
FIG. 13 is a flowchart of operations between a user equipment (UE) and a base station (BS) for performing a method of encoding and decoding a polar code, according to an embodiment of the disclosure.

FIG. 13 is a flowchart of operations of a user equipment (UE) and a base station (BS) for performing a method of encoding and decoding a polar code, according to an embodiment of the disclosure.

Referring to FIG. 13, it is assumed that the UE includes an encoding apparatus according to an embodiment of the disclosure, and the BS includes a decoding device which is capable of decoding an encoded polar code, according to an embodiment of the disclosure. However, this is only an example, and the BS may also perform the encoding method according to the disclosure, and the UE may also perform the decoding method according to the disclosure.

In operation 1310, the UE may transmit, to the BS, a message inquiring whether a PC polar code is applied.

In operation 1320, the BS may transmit, to the UE, a message including a response to whether the PC polar code is applied.

In operation 1330, the UE may transmit information about a parity bit identified according to an interconnection within a PC-chain of a polar code and within PC-chains of the polar code.

When the UE according to an embodiment of the disclosure receives a response that a PC polar code is applied from the BS, the UE may identify a parity bit according to an interconnection within a PC-chain of a polar code and between PC-chains of the polar code according to an embodiment of the disclosure. The UE may transmit information about the identified parity bit to the BS.

In operation 1340, the BS may transmit a message responding that the information about reception of the parity bit identified according to the interconnection within the PC-chain of the polar code and between the PC-chains of the polar code.

In operation 1350, the UE and the BS may design a PC polar code according to the encoding method according to an embodiment of the disclosure, and decode the designed PC polar code. For example, when the UE transmits a polar code to the BS, the BS may decode the polar code based on the information about the parity bit transmitted in operation 1330 described above.

However, this is an only an example, and the BS may determine parity bit index sets ($\mathcal{PA}$ and $\mathcal{P}$) appropriate for a code parameter and transmit the determined index sets to the UE, and the UE may decode the polar code received from the BS based on the received parity bit index sets.

When the parity bit selection method according to an embodiment of the disclosure is applied, similar or excellent decoding (i.e., BLER) performance as compared to the related art may be ensured in an overall code parameter area, and thus, the related-art polar code applied to next-generation communication, such as beyond 5G and 6G, may be replaced and various scenarios may be supported.

Figure 14:
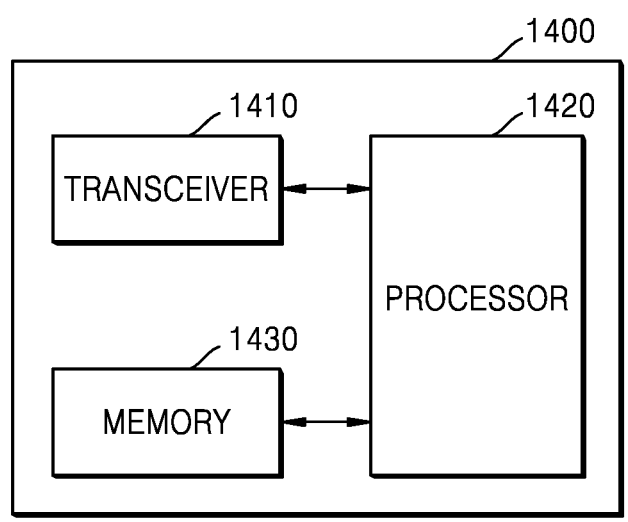
FIG. 14 is a block diagram of an encoding apparatus according to an embodiment of the disclosure.

FIG. 14 is a block diagram of an encoding apparatus according to an embodiment.

Referring to FIG. 14, an encoding apparatus 1400 may include a transceiver 1410, a processor 1420, and a memory 1430.

The transceiver 1410 may perform functions for transmitting and receiving signals via a wireless channel. For example, the transceiver 1410 may perform a conversion function between a baseband signal and a bitstream according to a physical layer standard of the system. For example, for signal transmission, the transceiver 1410 may generate complex symbols by encoding and modulating a bitstream for transmission. For signal reception, the transceiver 1410 may reconstruct a transmitted bitstream by demodulating and decoding the received baseband signal. Furthermore, the transceiver 1410 may perform up-conversion on the baseband signal to a radio frequency (RF) band signal and transmit the resultant signal through an antenna, and may perform down-conversion on an RF band signal received through the antenna to a baseband signal. For example, the transceiver 1410 may include a transmit filter, a receive filter, an amplifier, a mixer, an oscillator, a digital-to-analog converter (DAC), an analog-to-digital converter (ADC), etc.

The processor 1420 may control overall operations of the encoding apparatus 1400. For example, the processor 1420 may transmit and receive a signal via the transceiver 1410. In addition, the processor 1420 records and reads data on or from the memory 1430. The processor 1420 may perform functions of a protocol stack required from the communication standards. To do so, the processor 1420 may include at least one processor or microprocessor or may be a part of a processor. According to an embodiment, the processor 1420 may include at least one processor. Also, according to an embodiment, a part of the transceiver 1410 and/or the processor 1420 may be called a communication processor (CP).

The processor 1420 may control so that operations are performed according to at least one of the various embodiments related to the encoding method described above. For example, the processor 1420 may obtain state-indicator information for indicating a state of each bit based on an index set of bits included in a polar code. In addition, the processor 1420 may identify a weak-bit or a second weak-bit corresponding to a preset parity candidate position as a parity bit according to an interconnection within a PC-chain of a polar code and between PC-chains of the polar code, based on the number of weak-bits determined according to the state-indicator information and the number of bits to be used as parity bits. When the number of parity bits identified according to the interconnection within the PC-chain of a polar code and between the PC-chains of the polar code corresponds to the number of bits to be used as parity bits, the processor 1420 may terminate identification of a weak-bit or a second weak-bit as a parity bit. The processor 1420 may obtain a polar code including the identified parity bit.

In addition, the processor 1420 may transmit a polar code including the identified parity bit via the transceiver 1410.

The memory 1430 may store data such as basic programs, application programs, and configuration information for the operations of the encoding apparatus 1400. The memory 1430 may include a volatile memory, a non-volatile memory, or a combination of the volatile memory and the non-volatile memory. The memory 1430 may provide data stored at a request of the processor 1420.

Figure 15:
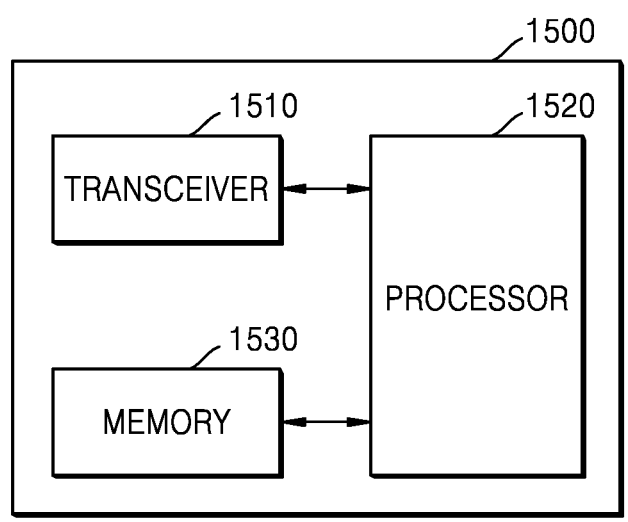
FIG. 15 is a block diagram of a decoding apparatus according to an embodiment of the disclosure.

FIG. 15 is a block diagram of a decoding apparatus according to an embodiment of the disclosure.

Referring to FIG. 15, a decoding apparatus 1500 may include a transceiver 1510, a processor 1520, and a memory 1530.

The transceiver 1510 may perform functions for transmitting and receiving signals via a wireless channel. For example, the transceiver 1510 may perform a conversion function between a baseband signal and a bitstream according to a physical layer standard of the system. For example, for signal transmission, the transceiver 1510 may generate complex symbols by encoding and modulating a bitstream for transmission. For signal reception, the transceiver 1510 may reconstruct a transmitted bitstream by demodulating and decoding the received baseband signal. Furthermore, the transceiver 1510 may perform up-conversion on the baseband signal to an RF band signal and transmit the resultant signal through an antenna, and may perform down-conversion on an RF band signal received through the antenna to a baseband signal. For example, the transceiver 1510 may include a transmit filter, a receive filter, an amplifier, a mixer, an oscillator, a DAC, an ADC, etc.

The processor 1520 may control overall operations of the decoding apparatus 1500. For example, the processor 1520 may transmit and receive a signal via the transceiver 1510. In addition, the processor 1520 records and reads data on or from the memory 1530. The processor 1520 may perform functions of a protocol stack required from the communication standards. To do so, the processor 1520 may include at least one processor or microprocessor or may be a part of a processor. According to an embodiment, the processor 1520 may include at least one processor. Also, according to an embodiment, a part of the transceiver 1510 and/or the processor 1520 may be called a CP.

The processor 1520 may decode a polar code including the parity bit identified according to the decoding method according to an embodiment of the disclosure described above. For example, the processor 1520 may obtain state-indicator information indicating a state of each bit based on an index set of bits included in a polar code received from the encoding apparatus. In addition, the processor 1520 may identify a weak-bit or a second weak-bit corresponding to a preset parity candidate position as a parity bit according to an interconnection within a PC-chain of a polar code or between PC-chains of the polar code, based on the number of weak-bits determined according to the state-indicator information and the number of bits to be used as parity bits. When the number of parity bits identified according to the interconnection within the PC-chain of the polar code and between the PC-chains of the polar code corresponds to the number of bits to be used parity bits, the processor 1520 may terminate identification of a weak-bit or a second weak-bit as a parity bit. The processor 1520 may obtain an information bit by decoding the polar code based on the identified parity bit.

In addition, the processor 1520 may transmit the polar code including the identified parity bit via the transceiver 1510.

The memory 1530 may store data such as basic programs, application programs, and configuration information for the operations of the decoding apparatus 1500. The memory 1530 may include a volatile memory, a non-volatile memory, or a combination of the volatile memory and the non-volatile memory. The memory 1530 may provide data stored at a request of the processor 1520.

A machine-readable storage medium may be provided in a form of a non-transitory storage medium. Here, the "non-transitory storage medium" only denotes a tangible device and does not contain a signal (for example, electromagnetic waves). This term does not distinguish a case where data is stored in the storage medium semi-permanently and a case where the data is stored in the storage medium temporarily. For example, the "non-transitory storage medium" may include a buffer where data is temporarily stored.

According to an embodiment, a method according to various embodiments disclosed in the present specification may be provided by being included in a computer program product. The computer program products are products that can be traded between sellers and buyers. The computer program product may be distributed in a form of machine-readable storage medium (for example, a compact disc read-only memory (CD-ROM)), or distributed (for example, downloaded or uploaded) through an application store (for example, PlayStore™) or directly or online between two user devices (for example, smart phones). In the case of online distribution, at least a part of the computer program product (for example, a downloadable application) may be at least temporarily generated or temporarily stored in a machine-readable storage medium, such as a server of a manufacturer, a server of an application store, or a memory of a relay server.

A method and apparatus for encoding and decoding of a polar code according to an embodiment serve to assist parity bits, which are appropriately arranged, to select a proper decoding path in a continuous removal list decoding process during decoding of the polar code.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method of encoding a polar code, the method comprising:
    obtaining state-indicator information indicating a state of each of bits included in the polar code based on an index set of the bits;
    identifying a weak-bit or a second weak-bit corresponding to a parity bit candidate position preset according to an interconnection within a parity-check (PC)-chain of the polar code and between PC-chains of the polar code as a parity bit, based on a number of weak-bits determined according to the state-indicator information and a number of bits to be used as parity bits;
    when a number of the parity bits identified according to the interconnection within the PC-chain of the polar code and between the PC-chains of the polar code corresponds to the number of bits to be used as the parity bits, terminating identification of the weak-bit or the second weak-bit as the parity bit;
    obtaining a polar code including the identified parity bit; and
    transmitting a signal comprising the polar code to an apparatus comprising a decoder for decoding the polar code.

2. The method of claim 1,
    wherein the identifying of the weak-bit or the second weak-bit as the parity bit comprises:
        based on the state-indicator information, determining sets of consecutive non-zero elements for each PC-chain of the index set as subblocks; and
        in a case in which the number of weak-bits determined according to the state-indicator information is greater than the number of bits to be used as the parity bits, when a weak-bit is included in a rearmost subblock for each PC-chain from among the determined subblocks, identifying a bit positioned last in the rearmost subblock including the weak-bit, and
    wherein the identified bit is updated to the parity bit.

3. The method of claim 2, wherein the identifying of the weak-bit or the second weak-bit as the parity bit comprises, after the updating, when a number of parity bits identified for each of the subblocks fails to reach the number of bits to be used as the parity bits, identifying a weak-bit neighboring a bit that is a weak-bit from among weak-bits included in a subblock in which a number of weak-bits is three or more from among the subblocks, as a parity bit according to type A.

4. The method of claim 3, wherein the identifying of the weak-bit or the second weak-bit as the parity bit comprises, in a case in which a number of parity bits updated after the identification of the parity bit according to the type A fails to reach the number of bits to be used as the parity bits, when a bit neighboring a weak-bit at an edge of each of the subblocks is a weak-bit, identifying the weak-bit at the edge as a parity bit according to type B.

5. The method of claim 4, wherein the identifying of the weak-bit or the second weak-bit as the parity bit comprises, in a case in which a number of parity bits updated after the identification of the parity bit according to the type B fails to reach the number of bits to be used as the parity bits, identifying a weak-bit as a parity bit according to type C according to priority determined based on a number of weak-bits in a subblock including a plurality of weak-bits from among the subblocks, a length of the subblock, and reliability of the weak-bits.

6. The method of claim 5,
wherein the identifying of the weak-bit or the second weak-bit as the parity bit comprises, in a case in which a number of parity bits updated after the identification of the parity bit according to the type C fails to reach the number of bits to be used as the parity bits, identifying a weak-bit included in at least one subblock in which a parity bit is not identified from among the subblocks, and
wherein the weak-bit included in the at least one subblock in which the parity bit is not identified from among the subblocks is updated to the parity bit.

7. The method of claim 6, wherein the identifying of the weak-bit or the second weak-bit as the parity bit comprises, after the updating, in a case in which a number of parity bits identified with respect to the subblocks fails to reach the number of bits to be used as the parity bits, when a bit having an index of i and a bit having an index of i+1 from among bits included in the subblocks are all weak-bits, identifying the bit having the index of i as the parity bit.

8. The method of claim 1, wherein the identifying of the weak-bit or the second weak-bit as the parity bit comprises:
based on the state-indicator information, determining sets of consecutive non-zero elements as each subblock for each PC-chain of the index set;
when it is identified that the number of weak-bits determined according to the state-indicator information is less than the number of bits to be used as the parity bits, identifying all of the determined weak-bits as the parity bits; and
identifying a second weak-bit corresponding to a parity bit candidate position preset according to the interconnection within the PC-chain of the polar code and between the PC-chains of the polar code, as the parity bit.

9. The method of claim 8, wherein the identifying the second weak-bit as the parity bit comprises:
identifying a second weak-bit other than a second weak-bit positioned first in each of the subblocks from among at least one second weak-bit;
when the identified second weak-bit is provided in plurality, updating a second weak-bit in which a balancing parameter value determined based on a position in the subblock from among the plurality of identified second weak-bits, as a parity bit; and
when a number of updated parity bits fails to reach the number of bits to be used as the parity bit, identifying at least some of second weak-bits not updated as parity bits from among the identified second weak-bits as the parity bits according to priority determined based on a number of second weak-bit in each of the subblocks and reliability of the second weak-bit.

10. An apparatus for encoding a polar code, the apparatus comprising:
a transceiver; and
at least one processor, wherein the at least one processor is configured to:
obtain state-indicator information indicating a state of each of bits included in the polar code based on an index set of the bits,
identify a weak-bit or a second weak-bit corresponding to a parity bit candidate position preset according to an interconnection within a parity-check (PC)-chain of the polar code and between PC-chains of the polar code, based on a number of weak-bits determined according to the state-indicator information and a number of bits to be used as parity bits,
when a number of the parity bits identified according to the interconnection within the PC-chain of the polar code and between the PC-chains of the polar code corresponds to the number of bits to be used as the parity bits, terminate identification of the weak-bit or the second weak-bit as the parity bit,
obtain a polar code including the identified parity bit, and
transmit, via the transceiver, a signal comprising the polar code to an apparatus comprising a decoder for decoding the polar code.

11. The apparatus of claim 10,
wherein the at least one processor is further configured to:
based on the state-indicator information, determine sets of consecutive non-zero elements for each PC-chain in the index set as subblocks, and
in a case in which it is identified that the number of weak-bits determined according to the state-indicator information is greater than the number of bits to be used as the parity bits, when a weak-bit is included in a rearmost subblock for each PC-chain from among the determined subblocks, identify a bit positioned last in the rearmost subblock including the weak-bit, and
wherein the identified bit is updated to the parity bit.

12. The apparatus of claim 11, wherein the at least one processor is further configured to, after the updating, when the number of parity bits identified for each of the subblocks fails to reach the number of bits to be used as the parity bits, identify a weak-bit neighboring a bit that is a weak-bit from among weak-bits included in a subblock in which a number of weak-bits is three or more from among the subblocks, as a parity bit according to type A.

13. The apparatus of claim 12, wherein the at least one processor is further configured to, in a case in which a number of parity bits updated after the identification of the parity bit according to the type A fails to reach the number of bits to be used as the parity bits, when a bit neighboring a weak-bit at an edge from among each of the subblocks is a weak-bit, identify the weak-bit at the edge as a parity bit according to type B.

14. The apparatus of claim 13, wherein the at least one processor is further configured to, in a case in which a number of parity bits updated after the identification of the parity bits according to the type B fails to reach the number of bits to be used as the parity bits, identify a weak-bit as a parity bit according to type C according to priority determined based on a number of weak-bits in a subblock including a plurality of weak-bits from among the subblocks, a length of the subblock, and reliability of the weak-bits.

15. The apparatus of claim 14,
wherein the at least one processor is further configured to, in a case in which a number of parity bits updated after the identification of the parity bit according to the type C fails to reach the number of bits to be used as the parity bits, identify a weak-bit included in at least one subblock in which a parity bit is not identified from among the subblocks, and
wherein the weak-bit included in the at least one subblock in which the parity bit is not identified from among the subblocks is updated to the parity bit.

16. The apparatus of claim 15, wherein the at least one processor is further configured to, after the updating, in a case in which a number of parity bits identified with respect to the subblocks fails to reach the number of bits to be used as the parity bits, when a bit having an index of i and a bit having an index of i+1 from among bits included in the subblocks are all weak-bits, identifying the bit having the index of i as the parity bit.

17. The apparatus of claim 10, wherein the at least one processor is further configured to:
based on the state-indicator information, determine sets of consecutive non-zero elements as each subblock for each PC-chain of the index set,
when it is identified that the number of weak-bits determined according to the state-indicator information is less than the number of bits to be used as the parity bits, identify all of the determined weak-bits as the parity bits, and
identify a second weak-bit corresponding to a parity bit candidate position preset according to the interconnection within the PC-chain of the polar code and between the PC-chains of the polar code, as the parity bit.

18. The apparatus of claim 17, wherein the at least one processor is further configured to:
identify a second weak-bit other than a second weak-bit positioned first in each of the subblocks from among at least one second weak-bit,
when the identified second weak-bit is provided in plurality, update a second weak-bit in which a balancing parameter value determined based on a position in the subblock from among the plurality of identified second weak-bits, as a parity bit, and
when a number of updated parity bits fails to reach the number of bits to be used as the parity bit, identify at least some of second weak-bits not updated as parity bits from among the identified second weak-bits as the parity bits according to priority determined based on a number of second weak-bit in each of the subblocks and reliability of the second weak-bit.

* * * * *